(12) United States Patent
Yanokuchi et al.

(10) Patent No.: US 11,841,521 B2
(45) Date of Patent: Dec. 12, 2023

(54) OPTICAL FILM, CIRCULARLY POLARIZING PLATE, AND ORGANIC ELECTROLUMINESCENCE DISPLAY DEVICE

(71) Applicant: FUJIFILM Corporation, Tokyo (JP)

(72) Inventors: Satoshi Yanokuchi, Kanagawa (JP); Shinpei Yoshida, Kanagawa (JP); Yuta Takahashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 74 days.

(21) Appl. No.: 17/698,500

(22) Filed: Mar. 18, 2022

(65) Prior Publication Data
US 2022/0206203 A1    Jun. 30, 2022

Related U.S. Application Data

(63) Continuation of application No. PCT/JP2020/036038, filed on Sep. 24, 2020.

(30) Foreign Application Priority Data

Sep. 26, 2019  (JP) ................. 2019-175987

(51) Int. Cl.
*G02B 5/30* (2006.01)
*H10K 50/86* (2023.01)

(52) U.S. Cl.
CPC .......... *G02B 5/3016* (2013.01); *H10K 50/86* (2023.02)

(58) Field of Classification Search
CPC .................................... G02B 5/3016
(Continued)

(56) References Cited

U.S. PATENT DOCUMENTS

2009/0096960 A1   4/2009 Uesaka
2014/0284583 A1   9/2014 Saitoh et al.
(Continued)

FOREIGN PATENT DOCUMENTS

JP   2001-021720 A   1/2001
JP   2003-215341 A   7/2003
(Continued)

OTHER PUBLICATIONS

International Search Report issued in PCT/JP2020/036038 dated Nov. 10, 2020.
(Continued)

*Primary Examiner* — Christopher M Raabe
(74) *Attorney, Agent, or Firm* — EDWARDS NEILS LLC; Jean C. Edwards, Esq.

(57) ABSTRACT

Provided is an optical film that has a thin thickness, is suitable in terms of continuous productivity, and exhibits suppressed tinting of black color in a front direction and an oblique direction in a case of being used as a circularly polarizing plate in an organic EL display device; a circularly polarizing plate; and an organic EL display device. The optical film includes an elongated support and a first, a second, and a third optically anisotropic layer in this order, in which a thickness of the elongated support is 10 to 45 μm, the first optically anisotropic layer is formed of a rod-like liquid crystal compound, the second optically anisotropic layer is formed by fixing a twist-aligned liquid crystal compound having a helical axis in a thickness direction, the third optically anisotropic layer is formed of a liquid crystal compound, and each optically anisotropic layer exhibits predetermined optical characteristics.

15 Claims, 6 Drawing Sheets

(58) Field of Classification Search
USPC .......................................................... 349/194
See application file for complete search history.

(56) References Cited

U.S. PATENT DOCUMENTS

| | | |
|---|---|---|
| 2016/0187554 A1 | 6/2016 | Lee et al. |
| 2020/0050009 A1* | 2/2020 | Saitoh .................. C09K 19/588 |
| 2023/0093491 A1* | 3/2023 | Okuda ................. G02B 5/3016 |
| | | 349/194 |

FOREIGN PATENT DOCUMENTS

| | | |
|---|---|---|
| JP | 2004-258623 A | 9/2004 |
| JP | 2006-201746 A | 8/2006 |
| JP | 2007-212959 A | 8/2007 |
| JP | 2007-279656 A | 10/2007 |
| JP | 5960743 B2 | 8/2016 |
| JP | 2016-528543 A | 9/2016 |

OTHER PUBLICATIONS

Written Opinion issued in PCT/JP2020/036038 dated Nov. 10, 2020.

International Preliminary Report on Patentability completed by WIPO on Mar. 15, 2022 in connection with International Patent Application No. PCT/JP2020/036038.

* cited by examiner

OPTICAL FILM, CIRCULARLY POLARIZING PLATE, AND ORGANIC ELECTROLUMINESCENCE DISPLAY DEVICE

CROSS-REFERENCE TO RELATED APPLICATIONS

This application is a Continuation of PCT International Application No. PCT/JP2020/036038 filed on Sep. 24, 2020, which was published under PCT Article 21(2) in Japanese, and which claims priority under 35 U.S.C. § 119(a) to Japanese Patent Application No. 2019-175987 filed on Sep. 26, 2019. The above applications are hereby expressly incorporated by reference, in their entirety, into the present application.

BACKGROUND OF THE INVENTION

1. Field of the Invention

The present invention relates to an optical film, a circularly polarizing plate, and an organic electroluminescence display device.

2. Description of the Related Art

An optically anisotropic layer having refractive index anisotropy is applied to various applications such as an antireflection film of a display device and an optical compensation film of a liquid crystal display device.

JP5960743B discloses a retardation plate having two types of optically anisotropic layers exhibiting predetermined optical characteristics.

SUMMARY OF THE INVENTION

On the other hand, in recent years, various devices are required to be thin, and the members used in the devices are also required to be thin. The retardation plate described in JP5960743B is formed on a support exhibiting predetermined optical characteristics, and the thickness of a laminate including such a support does not always meet the recent demand for thinning, and there is a need for improvement.

In addition, in a case where a retardation plate is formed in JP5960743B, an alignment film is formed on the support and a rubbing treatment is carried out at a predetermined angle, but the angle may be substantially orthogonal to a longitudinal direction, such as −94° with respect to the longitudinal direction of the support. At such an angle of the rubbing treatment, the rubbing treatment cannot be carried out continuously by roll-to-roll processing.

In addition, in a case where a circularly polarizing plate is prepared, bonding is carried out such that an absorption axis of a polarizer and an in-plane slow axis of a retardation plate are at a predetermined angle. In consideration of productivity, it is preferable that an elongated polarizer and an elongated retardation plate can be continuously bonded by roll-to-roll processing to produce a circularly polarizing plate. On the other hand, first, usually, in a case of an elongated polarizer, an absorption axis is often disposed in the longitudinal direction thereof. In addition, even in a case where an elongated retardation plate can be formed using a support that has been subjected to a rubbing treatment in a direction substantially orthogonal to a longitudinal direction as described in JP5960743B, the in-plane slow axis of the elongated retardation plate tends to be at a position substantially orthogonal to the longitudinal direction. Therefore, even in a case where such an elongated retardation plate and such an elongated polarizer are continuously bonded by roll-to-roll processing, it is not possible to prepare a circularly polarizing plate in which the absorption axis of the polarizer and the in-plane slow axis of the retardation plate are disposed at a desired angle.

That is, the retardation plate described in JP5960743B is difficult to produce by roll-to-roll processing in the rubbing treatment itself and is not suitable for bonding with a polarizer, which is inferior in terms of continuous productivity. Hereinafter, the phrase "suitable in terms of continuous productivity" means that the rubbing treatment can be continuously carried out by roll-to-roll processing, and the bonding of the polarizer can be continuously carried out by roll-to-roll processing in order to produce a polarizing plate satisfying a desired angular relationship.

Further, an optically anisotropic layer may be used as a member of a circularly polarizing plate for antireflection of an organic electroluminescence (EL) display device, and in an organic EL display device having a circularly polarizing plate, it is required to suppress the occurrence of a tint (tinting of black color) in which a black color is mixed with other colors in a case of being visually recognized from a front direction and an oblique direction.

The present invention has been made in view of the above circumstances, and an object of the present invention is to provide an optical film that has a thin thickness, is suitable in terms of continuous productivity, and exhibits suppressed tinting of black color in a front direction and an oblique direction in a case of being used as a circularly polarizing plate in an organic EL display device.

Another object of the present invention is to provide a circularly polarizing plate and an organic EL display device.

As a result of extensive studies on the problems of the related art, the present inventors have found that the foregoing objects can be achieved by the following configurations.

(1) An optical film including an elongated support, a first optically anisotropic layer, a second optically anisotropic layer, and a third optically anisotropic layer in this order,
 in which a thickness of the elongated support is 10 to 45 µm,
 the first optically anisotropic layer is a layer formed of a rod-like liquid crystal compound,
 the second optically anisotropic layer is a layer formed by fixing a twist-aligned liquid crystal compound having a helical axis in a thickness direction,
 the third optically anisotropic layer is a layer formed of a liquid crystal compound,
 an angle formed by a longitudinal direction of the elongated support and an in-plane slow axis of the first optically anisotropic layer is 5° to 50°,
 the in-plane slow axis of the first optically anisotropic layer is parallel to an in-plane slow axis on a surface of the second optically anisotropic layer on a first optically anisotropic layer side,
 a twist angle of the twist-aligned liquid crystal compound in the second optically anisotropic layer is 90°±30°,
 in a case where the in-plane slow axis of the first optically anisotropic layer is rotated 5° to 50° clockwise with respect to the longitudinal direction of the elongated support upon observation from a third optically anisotropic layer side toward an elongated support side, an in-plane slow axis on a surface of the second optically anisotropic layer opposite to the first optically anisotropic layer side is rotated clockwise with respect to the in-plane slow axis on the surface of the second optically anisotropic layer on the first optically anisotropic layer side, in a case where the in-plane slow axis of the first optically anisotropic layer is rotated 5° to 50° counterclockwise with respect to the longitudinal direction of the elongated support upon observation from the third optically anisotropic layer side toward the elongated support side, the in-plane slow axis on the surface of the second optically anisotropic layer opposite to the first optically anisotropic layer side is rotated counterclockwise with respect to the in-plane slow axis on the surface of the second optically anisotropic layer on the first optically anisotropic layer side, an in-plane retardation of the first optically anisotropic layer at a wavelength of 550 nm is 140 to 220 nm, a value of a product Δnd of a refractive index anisotropy Δn of the second optically anisotropic layer measured at a wavelength of 550 nm and a thickness d of the second optically anisotropic layer is 140 to 220 nm, in a case where the twist-aligned liquid crystal compound of the second optically anisotropic layer is a rod-like liquid crystal compound, an in-plane retardation of the third optically anisotropic layer at a wavelength of 550 nm is 0 to 10 nm, and a thickness direction retardation of the third optically anisotropic layer at a wavelength of 550 nm is −120 to −20 nm, and in a case where the twist-aligned liquid crystal compound of the second optically anisotropic layer is a disk-like liquid crystal compound, an in-plane retardation of the third optically anisotropic layer at a wavelength of 550 nm is 0 to 10 nm, and a thickness direction retardation of the third optically anisotropic layer at a wavelength of 550 nm is 20 to 120 nm.

(2) The optical film according to (1), in which an alignment film is substantially not disposed between the elongated support and the first optically anisotropic layer.

(3) The optical film according to (1) or (2), in which the angle formed by the longitudinal direction of the elongated support and the in-plane slow axis of the first optically anisotropic layer is 10° to 25°.

(4) The optical film according to any one of (1) to (3), in which the first optically anisotropic layer is a layer formed by fixing a homogeneously aligned rod-like liquid crystal compound.

(5) A circularly polarizing plate including the optical film according to any one of (1) to (4) and a polarizer.

(6) An organic electroluminescence display device including the circularly polarizing plate according to (5).

According to an aspect of the present invention, it is possible to provide an optical film that has a thin thickness, is suitable in terms of continuous productivity, and exhibits suppressed tinting of black color in a front direction and an oblique direction in a case of being used as a circularly polarizing plate in an organic EL display device.

According to another aspect of the present invention, it is possible to provide a circularly polarizing plate and an organic EL display device.

DESCRIPTION OF THE PREFERRED EMBODIMENTS

Figure 1:
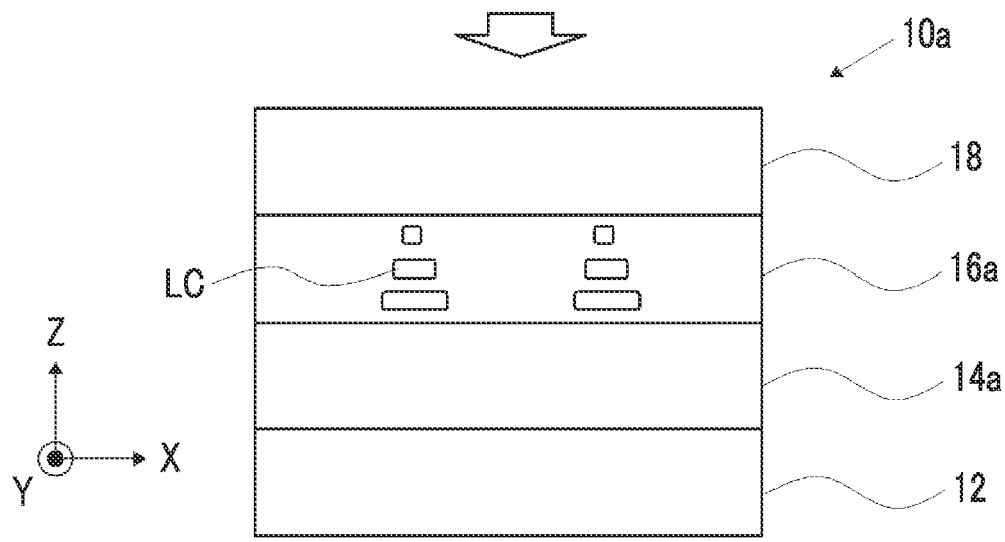
FIG. 1 is an example of a schematic cross-sectional view of a first embodiment of an optical film of the present invention.

Hereinafter, the present invention will be described in more detail. Any numerical range expressed using "to" in the present specification refers to a range including the numerical values before and after the "to" as a lower limit value and an upper limit value, respectively. First, the terms used in the present specification will be described.

The in-plane slow axis is defined at 550 nm unless otherwise specified.

In the present invention, $Re(\lambda)$ and $Rth(\lambda)$ represent an in-plane retardation and a thickness direction retardation at a wavelength $\lambda$, respectively. Unless otherwise specified, the wavelength $\lambda$ is 550 nm.

In the present invention, Re(λ) and Rth(λ) are values measured at a wavelength % in AxoScan (manufactured by Axometrics, Inc.). By inputting an average refractive index ((nx+ny+nz)/3) and a film thickness (d(μm)) in AxoScan, slow axis direction (°)

$$Re(\lambda)=R0(\lambda)$$

$$Rth(\lambda)=((nx+ny)/2-nz)\times d$$

are calculated.

Although R0(λ) is displayed as a numerical value calculated by AxoScan, it means Re(λ).

In the present specification, the refractive indexes nx, ny, and nz are measured using an Abbe refractometer (NAR-4T, manufactured by Atago Co., Ltd.) and using a sodium lamp (λ=589 nm) as a light source. In addition, in a case of measuring the wavelength dependence, it can be measured with a multi-wavelength Abbe refractometer DR-M2 (manufactured by Atago Co., Ltd.) in combination with a dichroic filter.

In addition, the values in Polymer Handbook (John Wiley & Sons, Inc.) and catalogs of various optical films can be used. The values of the average refractive index of main optical films are illustrated below: cellulose acylate (1.48), cycloolefin polymer (1.52), polycarbonate (1.59), polymethylmethacrylate (1.49), and polystyrene (1.59).

The term "light" in the present specification means an actinic ray or radiation, for example, an emission line spectrum of a mercury lamp, a far ultraviolet ray typified by an excimer laser, an extreme ultraviolet ray (EUV light), an X-ray, an ultraviolet ray, or an electron beam (EB). Of these, an ultraviolet ray is preferable.

The term "visible light" in the present specification refers to light in a wavelength range of 380 to 780 nm. In addition, the measurement wavelength in the present specification is 550 nm unless otherwise specified.

In addition, in the present specification, the relationship between angles (for example, "orthogonal" or "parallel") is intended to include a range of errors acceptable in the art to which the present invention pertains. Specifically, it means that an angle is within an error range of less than ±10° with respect to the exact angle, and the error with respect to the exact angle is preferably within a range of ±5° or less and more preferably within a range of ±3° or less.

A feature point of the optical film according to the embodiment of the present invention is that an optically anisotropic layer exhibiting predetermined optical characteristics is disposed on an elongated support.

First, the in-plane slow axis of the first optically anisotropic layer disposed on the elongated support is disposed so as to be at a predetermined angle with an elongated longitudinal direction. At this angle, it is possible to continuously carry out a rubbing treatment on the elongated support and the bonding at a predetermined angle with an absorption axis of a polarizer which will be described later, by roll-to-roll processing.

In JP5960743B, a support exhibiting a predetermined Rth was used, but this support was thick and did not meet the demand for thinning. On the other hand, in the present invention, the thinness is achieved by forming the first optically anisotropic layer to the third optically anisotropic layer as a layer formed of a liquid crystal compound.

Further, the first optically anisotropic layer to the third optically anisotropic layer satisfy predetermined optical characteristics, so that tinting of black color in a front direction and an oblique direction is suppressed in a case of being applied as a circularly polarizing plate in an organic EL display device.

First Embodiment

Figure 2:
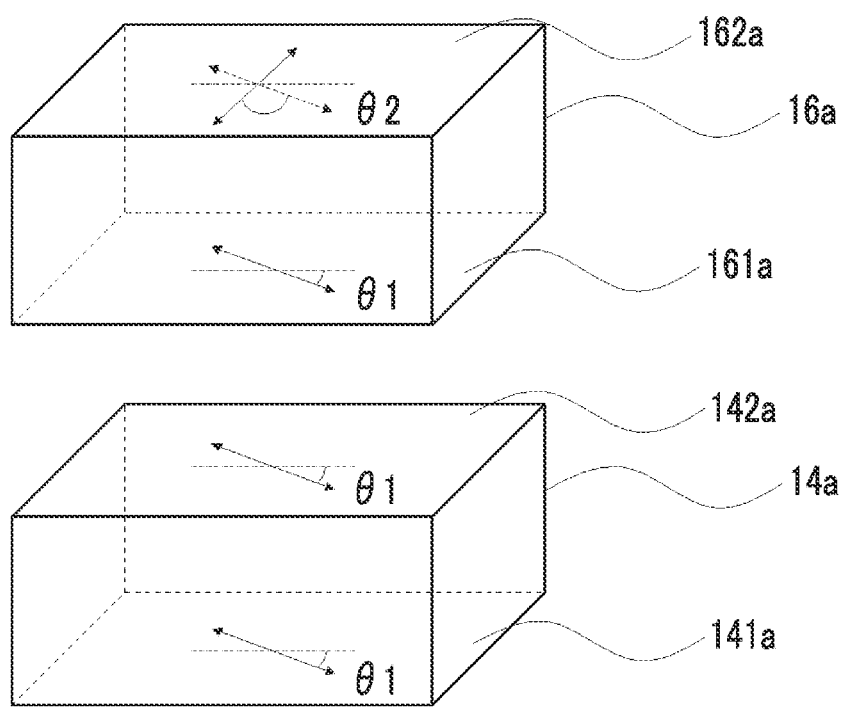
FIG. 2 is a view showing a relationship between a longitudinal direction of an elongated support and an in-plane slow axis of each of a first optically anisotropic layer and a second optically anisotropic layer, in one aspect of the first embodiment of the optical film of the present invention.
Figure 3:
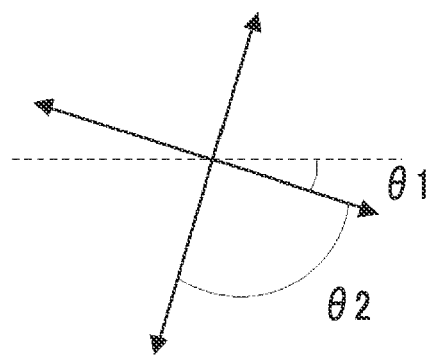
FIG. 3 is a schematic diagram showing a relationship of the angle between a longitudinal direction of an elongated support and an in-plane slow axis of each of the first optically anisotropic layer and the second optically anisotropic layer, upon observation from the direction of a white arrow in FIG. 1.

Hereinafter, the first embodiment of the optical film according to the embodiment of the present invention will be described with reference to the accompanying drawings. FIG. 1 shows a schematic cross-sectional view of a first embodiment of the optical film according to the embodiment of the present invention. In addition, FIG. 2 is a view showing the relationship between the longitudinal direction of the elongated support and the in-plane slow axis of each of the first optically anisotropic layer and the second optically anisotropic layer, in the first embodiment of the optical film according to the embodiment of the present invention. In FIG. 2, the description of the elongated support and the third optically anisotropic layer is omitted. In addition, FIG. 3 is a view showing a relationship of the angle between the longitudinal direction of the elongated support and the in-plane slow axis of each of the first optically anisotropic layer and the second optically anisotropic layer, upon observation from the white arrow in FIG. 1.

An optical film 10a has an elongated support 12, a first optically anisotropic layer 14a, a second optically anisotropic layer 16a, and a third optically anisotropic layer 18. The second optically anisotropic layer 16a is a layer formed by fixing a twist-aligned liquid crystal compound LC having a helical axis in a thickness direction.

Hereinafter, each member will be described in detail.

(Elongated Support 12)

The elongated support 12 is a support extending in a longitudinal direction, and is a member for supporting the first optically anisotropic layer 14a or the like.

The length of the elongated support 12 in a longitudinal direction is not particularly limited, and a support having a length of 10 m or more is preferable. From the viewpoint of productivity, a support having a length of 100 m or more is preferable. The length in a longitudinal direction is not particularly limited, and is often 10,000 m or less.

The width of the elongated support is not particularly limited and is often 150 to 3,000 mm and preferably 300 to 2,000 mm.

The elongated support 12 is preferably a transparent elongated support. The transparent elongated support is intended to refer to a support having a visible light transmittance of 60% or more, which preferably has a visible light transmittance of 80% or more and more preferably 90% or more.

The thickness direction retardation value (Rth(550)) of the elongated support 12 at a wavelength of 550 nm is not particularly limited, and is preferably −30 to 100 nm and more preferably −20 to 50 nm.

The in-plane retardation value (Re(550)) of the elongated support 12 at a wavelength of 550 nm is not particularly limited and is preferably 0 to 20 nm and more preferably 0 to 10 nm.

A polymer having excellent optical performance transparency, mechanical strength, heat stability, moisture shielding property, isotropy, and the like is preferable as the material for forming the elongated support 12.

Examples of the polymer film that can be used as the elongated support 12 include a cellulose acylate film (for example, a cellulose triacetate film, a cellulose diacetate film, a cellulose acetate butyrate film, and a cellulose acetate propionate film), a polyolefin film such as polyethylene or polypropylene, a polyester film such as polyethylene terephthalate or polyethylene naphthalate, a polyether sulfone film, a polyacrylic film such as polymethylmethacrylate, a polyurethane film, a polycarbonate film, a polysulfone film, a polyether film, a polymethylpentene film, a polyether ketone film, a (meth)acrylic nitrile film, and a film of a polymer having an alicyclic structure (a norbornene-based resin (ARTON: trade name, manufactured by JSR Corporation), or an amorphous polyolefin (ZEONEX: trade name, manufactured by Zeon Corporation)).

Above all, the material for the polymer film is preferably triacetyl cellulose, polyethylene terephthalate, or a polymer having an alicyclic structure.

The elongated support 12 may contain various additives (for example, an optical anisotropy adjuster, a wavelength dispersion adjuster, a fine particle, a plasticizer, an ultraviolet inhibitor, a deterioration inhibitor, and a release agent).

The thickness of the elongated support 12 is 10 to 45 μm, and is preferably 20 to 40 μm from the viewpoint of being more suitable in terms of continuous productivity.

In addition, the elongated support 12 may consist of a plurality of layers laminated.

In order to improve the adhesion of the elongated support 12 to the layer provided thereon, the surface of the elongated support 12 may be subjected to a surface treatment (for example, a glow discharge treatment, a corona discharge treatment, an ultraviolet (UV) treatment, or a flame treatment).

In addition, an adhesive layer (undercoat layer) may be provided on the elongated support 12.

The elongated support 12 may be a so-called temporary support.

In addition, the surface of the elongated support 12 may be directly subjected to a rubbing treatment. That is, the elongated support 12 that has been subjected to a rubbing treatment may be used. The direction of the rubbing treatment is not particularly limited, and an optimum direction is appropriately selected according to the direction in which the liquid crystal compound is desired to be aligned.

A treatment method widely adopted as a liquid crystal alignment treatment step of a liquid crystal display (LCD) can be applied for the rubbing treatment. That is, a method of obtaining alignment by rubbing the surface of the elongated support 12 in a certain direction with paper, gauze, felt, rubber, nylon fiber, polyester fiber, or the like can be used.

(First Optically Anisotropic Layer 14a)

The first optically anisotropic layer 14a is a layer disposed between the elongated support 12 and the second optically anisotropic layer 16a which will be described later.

The first optically anisotropic layer 14a is a layer formed of a rod-like liquid crystal compound. More specifically, the first optically anisotropic layer 14a is a layer formed of a composition containing a rod-like liquid crystal compound.

The first optically anisotropic layer 14a may be a layer exhibiting predetermined optical characteristics, and is preferably a layer formed by fixing a homogeneously aligned rod-like liquid crystal compound, for example. That is, the first optically anisotropic layer 14a is preferably a layer formed by fixing an alignment state of a homogeneously aligned rod-like liquid crystal compound.

The "fixed" state is a state in which the alignment of the liquid crystal compound is maintained. Specifically, the "fixed" state is preferably a state in which, in a temperature range of usually 0° C. to 50° C. or in a temperature range of −30° C. to 70° C. under more severe conditions, the layer has no fluidity and a fixed alignment morphology can be maintained stably without causing a change in the alignment morphology due to an external field or an external force.

The homogeneous alignment in the present specification refers to a state in which a molecular axis of a liquid crystal compound (for example, a major axis in a case of a rod-like liquid crystal compound) is arranged horizontally and in the same direction with respect to the layer surface (optical uniaxiality).

Here, "horizontal" does not require that the molecular axis of the liquid crystal compound is strictly horizontal with respect to the surface of the composition layer, but is intended to mean an alignment in which the tilt angle of the average molecular axis of the liquid crystal compound in the layer with respect to the layer surface is less than 20°.

In addition, the same direction does not require that the molecular axis of the liquid crystal compound is arranged strictly in the same direction with respect to the surface of the composition layer, but is intended to mean that, in a case where the direction of the slow axis is measured at any 20 positions in the plane, the maximum difference between the slow axis directions among the slow axis directions at 20 positions (the difference between the two slow axis directions having a maximum difference among the 20 slow axis directions) is less than 10°.

The in-plane retardation of the first optically anisotropic layer 14a at a wavelength of 550 nm is 140 to 220 nm, and is more preferably 150 to 200 nm from the viewpoint of further suppressed tinting of black color in a case of being visually recognized from the front direction or oblique direction of an organic EL display device in which the optical film according to the embodiment of the present invention is applied as a circularly polarizing plate (hereinafter, also simply referred to as "the viewpoint of further suppressed tinting of black color").

As shown in FIG. 2, an angle θ1 formed by the longitudinal direction of the elongated support 12 and the in-plane slow axis of the first optically anisotropic layer 14a is 5 to 50°. From the viewpoint of being more suitable in terms of continuous productivity, the angle θ1 is preferably 5° to 40° and more preferably 5° to 25°.

FIG. 2 will be described in detail. The arrows in the first optically anisotropic layer 14a in FIG. 2 represent the in-plane slow axes on the respective surfaces, and the broken lines represent the longitudinal direction of the elongated support. As shown in FIG. 2, the in-plane slow axis on a surface 141a of the first optically anisotropic layer 14a opposite to the second optically anisotropic layer 16a side and the in-plane slow axis on a surface 142a of the first optically anisotropic layer 14a on the second optically anisotropic layer 16a side are parallel to each other, and the angle θ1 formed by each of the in-plane slow axes with respect to the longitudinal direction of the elongated support is 5° to 50°.

As shown in FIG. 3, upon observation from the white arrow side in FIG. 1 (upon observation of the elongated support 12 from the third optically anisotropic layer 18 side), the in-plane slow axis of the first optically anisotropic layer 14a is rotated clockwise by θ1° with respect to the longitudinal direction of the elongated support represented by the broken line. That is, the in-plane slow axis of the first optically anisotropic layer 14a is located at a position rotated clockwise by θ1°.

The rod-like liquid crystal compound used for forming the first optically anisotropic layer 14a is not particularly limited, and a known rod-like liquid crystal compound is used. For example, the rod-like liquid crystal compounds described in claim 1 of JP1999-513019A (JP-H11-513019A)

and paragraphs [0026] to [0098] of JP2005-289980A can be preferably used as the rod-like liquid crystal compound.

The rod-like liquid crystal compounds may be used alone or in combination of two or more thereof.

The rod-like liquid crystal compound may have a polymerizable group. The type of the polymerizable group is not particularly limited, and is preferably a functional group capable of an addition polymerization reaction, more preferably a polymerizable ethylenic unsaturated group or a ring-polymerizable group, and still more preferably a (meth) acryloyl group, a vinyl group, a styryl group, or an allyl group.

As will be described in detail later, the first optically anisotropic layer 14a is preferably a layer formed by fixing a rod-like liquid crystal compound having a polymerizable group by polymerization, and more preferably a layer formed by fixing a homogeneously aligned rod-like liquid crystal compound having a polymerizable group by polymerization.

(Second Optically Anisotropic Layer 16a)

The second optically anisotropic layer 16a is a layer disposed between the first optically anisotropic layer 14a and the third optically anisotropic layer 18.

As shown in FIG. 1, the second optically anisotropic layer 16a is a layer formed by fixing a twist-aligned liquid crystal compound LC having a helical axis in a thickness direction (in a z-axis direction in FIG. 1). The second optically anisotropic layer 16a is preferably a layer formed by fixing a so-called chiral nematic phase having a helical structure. In a case of forming the above phase, it is preferable to use a mixture of a liquid crystal compound exhibiting a nematic liquid crystal phase and a chiral agent which will be described later.

The meaning of the "fixed" state is as described above.

The value of the product $\Delta nd$ of the refractive index anisotropy $\Delta n$ of the second optically anisotropic layer 16a and the thickness d of the second optically anisotropic layer 16a measured at a wavelength of 550 nm is 140 to 220 nm. From the viewpoint of further suppressed tinting of black color, the $\Delta nd$ is preferably 150 to 210 nm and more preferably 160 to 200 nm.

The refractive index anisotropy $\Delta n$ means the refractive index anisotropy of the optically anisotropic layer.

The $\Delta nd$ is measured using an AxoScan (polarimeter) device manufactured by Axometrics, Inc. and using device analysis software of Axometrics, Inc.

The twist angle of the liquid crystal compound LC (twist angle of an alignment direction of the liquid crystal compound LC) is 90°±30° (within a range of 60° to 120°). From the viewpoint of further suppressed tinting of black color, the twist angle of the liquid crystal compound LC is more preferably 90°±20° (within a range of 700 to 110°) and still more preferably 90°±10° (within a range of 80° to 100°).

The twist angle is measured using an AxoScan (polarimeter) device manufactured by Axometrics, Inc. and using device analysis software of Axometrics, Inc.

In addition, the phrase "the liquid crystal compound is twist-aligned" is intended to mean that the liquid crystal compound from one main surface to the other main surface of the second optically anisotropic layer 16a is twisted about the thickness direction of the second optically anisotropic layer 16a. Along with this, the alignment direction (in-plane slow axis direction) of the liquid crystal compound differs depending on the position of the second optically anisotropic layer 16a in a thickness direction.

The positional relationship of the in-plane slow axis of the second optically anisotropic layer 16a will be described with reference to FIG. 2. The arrows in the second optically anisotropic layer 16a in FIG. 2 represent the in-plane slow axis at each surface.

The in-plane slow axis of the first optically anisotropic layer 14a is parallel to the in-plane slow axis on the surface of the second optically anisotropic layer 16a on a first optically anisotropic layer 14a side. In other words, the angle formed by the in-plane slow axis on the surface 161a of the second optically anisotropic layer 16a on the first optically anisotropic layer 14a side and the longitudinal direction of the elongated support corresponds to the above-mentioned $\theta 1$.

In addition, the in-plane slow axis on the surface 161a of the second optically anisotropic layer 16a on the first optically anisotropic layer 14a side and the in-plane slow axis on the surface 162a of the second optically anisotropic layer 16a opposite to the first optically anisotropic layer 14a side form the above-mentioned twist angle (within a range of 90°±30°). In other words, upon observation from the white arrow side in FIG. 1 (upon observation of the elongated support 12 from the third optically anisotropic layer 18 side), the in-plane slow axis on the surface 162a of the second optically anisotropic layer 16a opposite to the first optically anisotropic layer 14a side is rotated clockwise by a predetermined angle (within a range of 90°±30°) with respect to the in-plane slow axis on the surface 161a of the second optically anisotropic layer 16a on the first optically anisotropic layer 14a side.

That is, as shown in FIG. 3, upon observation from the white arrow side in FIG. 1 (upon observation of the elongated support 12 from the third optically anisotropic layer 18 side), the in-plane slow axis on the surface 162a of the second optically anisotropic layer 16a opposite to the first optically anisotropic layer 14a side is located at a position rotated by a predetermined angle clockwise by $\theta 2°$ with respect to the in-plane slow axis of the first optically anisotropic layer 14a.

The type of the liquid crystal compound used for forming the second optically anisotropic layer 16a is not particularly limited, and examples thereof include a rod-like liquid crystal compound and a disk-like liquid crystal compound (discotic liquid crystal compound). Examples of the rod-like liquid crystal compound are as described above.

For example, the disk-like liquid crystal compounds described in paragraphs [0020] to [0067] of JP2007-108732A and paragraphs [0013] to [0108] of JP2010-244038A can be preferably used as the disk-like liquid crystal compound.

The liquid crystal compound may have a polymerizable group. The type of the polymerizable group is not particularly limited, and is preferably a functional group capable of an addition polymerization reaction, more preferably a polymerizable ethylenic unsaturated group or a ring-polymerizable group, and still more preferably a (meth)acryloyl group, a vinyl group, a styryl group, or an allyl group.

The second optically anisotropic layer 16a is preferably a layer formed by fixing a liquid crystal compound having a polymerizable group by polymerization. More specifically, the second optically anisotropic layer 16a is more preferably a layer formed by fixing a twist-aligned liquid crystal compound having a polymerizable group by polymerization.

(Third Optically Anisotropic Layer 18)

The third optically anisotropic layer 18 is a layer disposed on the surface side of the second optically anisotropic layer 16a opposite to the first optically anisotropic layer 14a side.

The third optically anisotropic layer 18 is a layer formed of a liquid crystal compound. More specifically, the third optically anisotropic layer 18 is a layer formed of a composition containing a liquid crystal compound.

The third optically anisotropic layer 18 may be a layer exhibiting predetermined optical characteristics, and is preferably a layer formed by fixing a homeotropically aligned liquid crystal compound, for example. That is, the third optically anisotropic layer 18 is preferably a layer formed by fixing an alignment state of a homeotropically aligned liquid crystal compound.

The meaning of the "fixed" state is as described above.

in a case where the twist-aligned liquid crystal compound of the second optically anisotropic layer 16a is a rod-like liquid crystal compound, an in-plane retardation of the third optically anisotropic layer 18 at a wavelength of 550 nm is 0 to 10 nm, and a thickness direction retardation of the third optically anisotropic layer 18 at a wavelength of 550 nm is −120 to −20 nm.

The in-plane retardation is preferably 0 to 5 nm from the viewpoint of further suppressed tinting of black color. The thickness direction retardation is preferably −110 to −30 nm and more preferably −100 to −40 nm from the viewpoint of further suppressed tinting of black color.

In order to achieve the above optical characteristics, the third optically anisotropic layer 18 is preferably a layer formed of a rod-like liquid crystal compound.

In addition, in a case where the twist-aligned liquid crystal compound of the second optically anisotropic layer 16a is a disk-like liquid crystal compound, the in-plane retardation of the third optically anisotropic layer 18 at a wavelength of 550 nm is 0 to 10 nm, and the thickness direction retardation of the third optically anisotropic layer 18 at a wavelength of 550 nm is 20 to 120 nm.

The in-plane retardation is preferably 0 to 5 nm from the viewpoint of further suppressed tinting of black color. The thickness direction retardation is preferably 30 to 110 nm and more preferably 40 to 100 nm from the viewpoint of further suppressed tinting of black color.

In order to achieve the above optical characteristics, the third optically anisotropic layer 18 is preferably a layer formed of a disk-like liquid crystal compound.

The type of the liquid crystal compound used for forming the third optically anisotropic layer 18 is not particularly limited, and examples thereof include a rod-like liquid crystal compound and a disk-like liquid crystal compound.

Examples of the rod-like liquid crystal compound and the disk-like liquid crystal compound are as described above.

The liquid crystal compound may have a polymerizable group. The type of the polymerizable group is not particularly limited, and is preferably a functional group capable of an addition polymerization reaction, more preferably a polymerizable ethylenic unsaturated group or a ring-polymerizable group, and still more preferably a (meth)acryloyl group, a vinyl group, a styryl group, or an allyl group.

As will be described in detail later, the third optically anisotropic layer 18 is preferably a layer formed by fixing a liquid crystal compound having a polymerizable group by polymerization.

Second Embodiment

Figure 4:
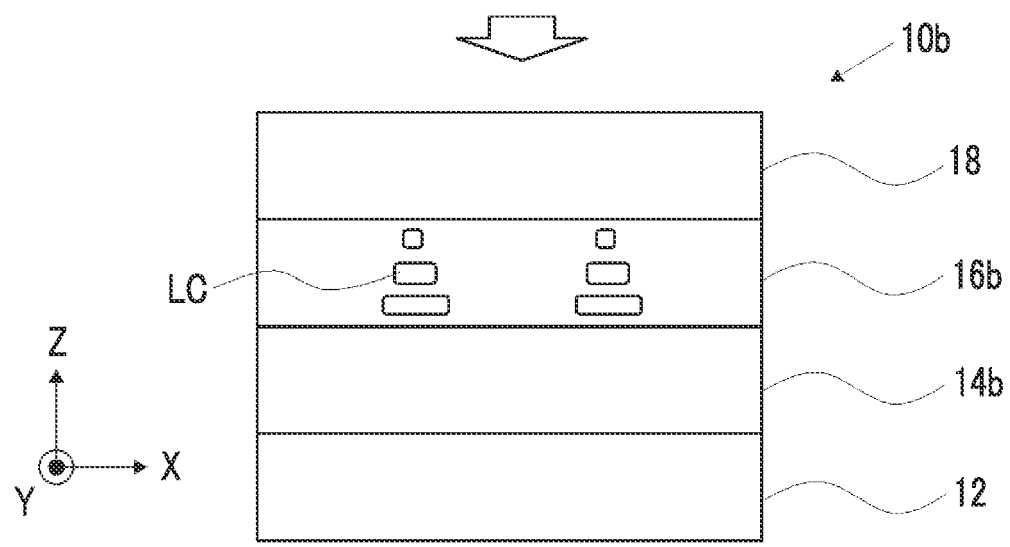
FIG. 4 is an example of a schematic cross-sectional view of a second embodiment of the optical film of the present invention.
Figure 5:
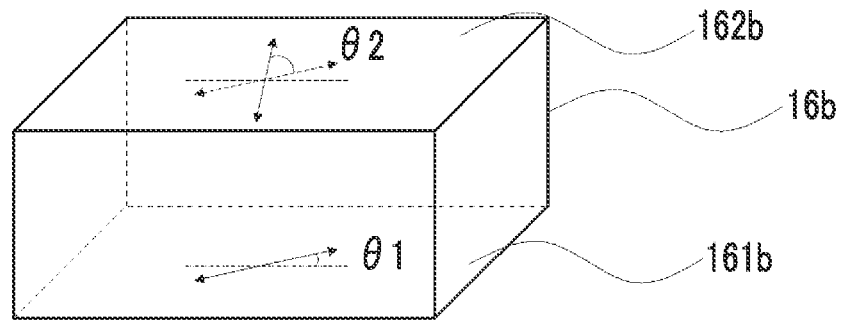
FIG. 5 is a view showing a relationship between a longitudinal direction of an elongated support and an in-plane slow axis of each of a first optically anisotropic layer and a second optically anisotropic layer, in one aspect of the second embodiment of the optical film of the present invention.
Figure 6:
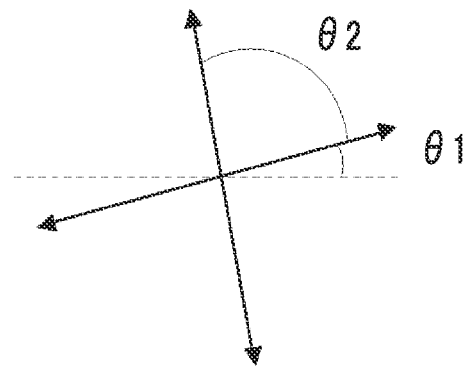
FIG. 6 is a schematic diagram showing a relationship of the angle between a longitudinal direction of an elongated support and an in-plane slow axis of each of the first optically anisotropic layer and the second optically anisotropic layer, upon observation from the direction of a white arrow in FIG. 4.

Hereinafter, the second embodiment of the optical film according to the embodiment of the present invention will be described with reference to the accompanying drawings. FIG. 4 shows a schematic cross-sectional view of a second embodiment of the optical film according to the embodiment of the present invention. In addition, FIG. 5 is a view showing the relationship between the longitudinal direction of the elongated support and the in-plane slow axis of each of the first optically anisotropic layer and the second optically anisotropic layer, in the second embodiment of the optical film according to the embodiment of the present invention. In FIG. 5, the description of the elongated support and the third optically anisotropic layer is omitted. In addition, FIG. 6 is a view showing a relationship of the angle between the longitudinal direction of the elongated support and the in-plane slow axis of each of the first optically anisotropic layer and the second optically anisotropic layer, upon observation from the white arrow in FIG. 4.

As shown in FIG. 4, an optical film 10b has an elongated support 12, a first optically anisotropic layer 14b, a second optically anisotropic layer 16b, and a third optically anisotropic layer 18. The second optically anisotropic layer 16b is a layer formed by fixing a twist-aligned liquid crystal compound LC having a helical axis in a thickness direction.

The first embodiment and the second embodiment have the same configuration except for the relationship between the positions of the in-plane slow axes in the first optically anisotropic layer 14b and the second optically anisotropic layer 16b, and therefore the description thereof will be omitted. Hereinafter, the relationship between the positions of the in-plane slow axes in the first optically anisotropic layer 14b and the second optically anisotropic layer 16b in the optical film 10b will be mainly described in detail.

As shown in FIG. 5, an angle θ1 formed by the longitudinal direction of the elongated support and the in-plane slow axis of the first optically anisotropic layer 14b is 5° to 50°. From the viewpoint of being more excellent in terms of continuous productivity, the angle θ1 is preferably 5° to 40° and more preferably 5° to 25°.

FIG. 5 will be described in detail. The arrows in the first optically anisotropic layer 14b in FIG. 5 represent the in-plane slow axes on the respective surfaces, and the broken lines represent the longitudinal direction of the elongated support. As shown in FIG. 5, the in-plane slow axis on a surface 141b of the first optically anisotropic layer 14b opposite to the second optically anisotropic layer 16b side and the in-plane slow axis on a surface 142b of the first optically anisotropic layer 14b on the second optically anisotropic layer 16b side are parallel to each other, and the angle θ1 formed by each of the in-plane slow axes with respect to the longitudinal direction of the elongated support is 5° to 50°.

As shown in FIG. 6, upon observation from the white arrow side in FIG. 4 (upon observation of the elongated support 12 from the third optically anisotropic layer 18 side), the in-plane slow axis of the first optically anisotropic layer 14b is rotated counterclockwise by θ1° with respect to the longitudinal direction of the elongated support represented by the broken line. That is, the in-plane slow axis of the first optically anisotropic layer 14b is located at a position rotated counterclockwise by θ1°.

Next, the positional relationship of the in-plane slow axis of the second optically anisotropic layer 16b will be described with reference to FIG. 5. The arrows in the second optically anisotropic layer 16b in FIG. 5 represent the in-plane slow axis at each surface. The in-plane slow axis of the first optically anisotropic layer 14b is parallel to the in-plane slow axis on the surface of the second optically anisotropic layer 16b on a first optically anisotropic layer 14b side. That is, the angle formed by the in-plane slow axis on the surface 161b of the second optically anisotropic layer 16b on the first optically anisotropic layer 14b side and the longitudinal direction of the elongated support corresponds to the above-mentioned θ1.

In addition, the in-plane slow axis on the surface 161b of the second optically anisotropic layer 16b on the first optically anisotropic layer 14b side and the in-plane slow axis on the surface 162b of the second optically anisotropic layer 16b opposite to the first optically anisotropic layer 14b side form the above-mentioned twist angle (within a range of 90°±30°). In other words, upon observation from the white arrow side in FIG. 4 (upon observation of the elongated support 12 from the third optically anisotropic layer 18 side), the in-plane slow axis on the surface 162b of the second optically anisotropic layer 16b opposite to the first optically anisotropic layer 14b side is rotated counterclockwise by a predetermined angle (within a range of 90°±30°) with respect to the in-plane slow axis on the surface 161b of the second optically anisotropic layer 16b on the first optically anisotropic layer 14b side.

That is, as shown in FIG. 6, upon observation from the white arrow side in FIG. 4 (upon observation of the elongated support 12 from the third optically anisotropic layer 18 side), the in-plane slow axis on the surface 162b of the second optically anisotropic layer 16b opposite to the first optically anisotropic layer 14b side is located at a position rotated by a predetermined angle (twist angle) counterclockwise by θ2° with respect to the in-plane slow axis of the first optically anisotropic layer 14b.

<Other Layers>

The optical film may have a layer other than the elongated support, the first optically anisotropic layer, the second optically anisotropic layer, and the third optically anisotropic layer.

Examples of the other layer include an alignment film.

The alignment film can be formed by means such as rubbing treatment of an organic compound (preferably a polymer), oblique vapor deposition of an inorganic compound, formation of a layer having microgrooves, or accumulation of an organic compound (for example, ω-tricosanoic acid, dioctadecylmethylammonium chloride, or methyl stearate) by the Langmuir-Blodgett (LB) film method.

Further, there is also known an alignment film capable of expressing an alignment function by application of an electric field, application of a magnetic field, or light (preferably polarized light) irradiation.

The alignment film is preferably formed by a rubbing treatment of a polymer.

In the present invention, it is preferable that there is substantially no alignment film in at least one between the elongated support and the first optically anisotropic layer, between the first optically anisotropic layer and the second optically anisotropic layer, or between the second optically anisotropic layer and the third optically anisotropic layer.

The expression "there is substantially no alignment film" in the present specification means that it does not include a film formed solely to function as an alignment film. Even in a case where the surface of a lower layer contributes to the alignment of a liquid crystal compound in an upper layer, unless the lower layer is formed for use only as an alignment film, such a layer is included in the present invention.

<Method for Producing Optical Film>

A method for producing the above-mentioned optical film is not particularly limited, and a known method can be adopted. In particular, the method for producing the above-mentioned optical film can be continuously carried out by roll-to-roll processing.

For example, an optical film can be produced by preparing a first optically anisotropic layer to a third optically anisotropic layer each exhibiting predetermined optical characteristics, and bonding the optically anisotropic layers and an elongated support in a predetermined order through an adhesion layer (for example, a pressure-sensitive adhesive layer or an adhesive layer).

In addition, an optical film may be produced by sequentially preparing a first optically anisotropic layer to a third optically anisotropic layer on an elongated support by using a polymerizable liquid crystal composition which will be described later. That is, the polymerizable liquid crystal composition may be applied onto the elongated support to form the first optically anisotropic layer, the polymerizable liquid crystal composition may be applied onto the first optically anisotropic layer to form the second optically anisotropic layer, and further, the polymerizable liquid crystal composition may be applied onto the second optically anisotropic layer to form the third optically anisotropic layer.

In addition, the above-mentioned method of bonding the optically anisotropic layers and the above-mentioned method of forming the optically anisotropic layer using the polymerizable liquid crystal composition may be combined.

The first optically anisotropic layer to the third optically anisotropic layer are all layers formed of a liquid crystal compound (for example, a rod-like liquid crystal compound or a disk-like liquid crystal compound), and the production method thereof is not particularly limited and is preferably a method using a composition containing a liquid crystal compound having a polymerizable group (for example, a rod-like liquid crystal compound having a polymerizable group and a disk-like liquid crystal compound having a polymerizable group) (hereinafter, also simply referred to as "polymerizable liquid crystal composition").

Hereinafter, the method using the polymerizable liquid crystal composition will be described in detail.

The polymerizable liquid crystal composition contains a liquid crystal compound having a polymerizable group. Examples of the liquid crystal compound include a rod-like liquid crystal compound and a disk-like liquid crystal compound as described above.

The polymerizable liquid crystal composition may contain a component other than the liquid crystal compound having a polymerizable group. The other component may be, for example, a polymerization initiator. The polymerization initiator used is selected according to the type of polymerization reaction, and examples thereof include a thermal polymerization initiator and a photopolymerization initiator.

The content of the polymerization initiator in the polymerizable liquid crystal composition is preferably 0.01% to 20% by mass and more preferably 0.5% to 10% by mass with respect to the total solid content of the composition.

The solid content means a component capable of forming an optically anisotropic layer from which a solvent has been removed, and even in a case where a component itself is in a liquid state, such a component is regarded as the solid content.

The polymerizable liquid crystal composition may contain a polymerizable monomer other than the liquid crystal compound having a polymerizable group. Examples of the polymerizable monomer include radically polymerizable or cationically polymerizable compounds, among which a polyfunctional radically polymerizable monomer is preferable.

The content of the polymerizable monomer in the polymerizable liquid crystal composition is preferably 1% to 50% by mass and more preferably 2% to 30% by mass with respect to the total mass of the liquid crystal compound.

Examples of other components that may be contained in the polymerizable liquid crystal composition include an alignment control agent (a vertical alignment agent and a horizontal alignment agent), a surfactant, an adhesion improver, a plasticizer, and a solvent, in addition to the foregoing components.

The polymerizable liquid crystal composition preferably contains a chiral agent in order to twist-align a liquid crystal compound as in the second optically anisotropic layer. The chiral agent is added to twist-align a liquid crystal compound, but of course, it is not necessary to add the chiral agent in a case where the liquid crystal compound is a compound exhibiting an optical activity such as having an asymmetric carbon in a molecule thereof. In addition, it is not necessary to add the chiral agent, depending on the production method and the twist angle.

The chiral agent is not particularly limited in a structure thereof as long as it is compatible with the liquid crystal compound used in combination. Any of the known chiral agents (for example, "Liquid Crystal Device Handbook" edited by the 142nd Committee of the Japan Society for the Promotion of Science, Chapter 3, 4-3, Chiral agent for TN and STN, p. 199, 1989) can be used.

The amount of the chiral agent used is not particularly limited and is adjusted such that the above-mentioned twist angle is achieved.

As the method for preparing an optically anisotropic layer, for example, there is a method in which a polymerizable liquid crystal composition is applied to form a coating film, the coating film is subjected to an alignment treatment to align a polymerizable liquid crystal compound, and a curing treatment is carried out.

The object onto which the polymerizable liquid crystal composition is applied is not particularly limited, and examples thereof include the elongated support and the first optically anisotropic layer to the third optically anisotropic layer as described hereinbefore.

The object onto which the polymerizable liquid crystal composition is applied may be subjected to a rubbing treatment in order to bring the direction of the in-plane slow axis of the formed optically anisotropic layer into a predetermined direction. For example, an elongated support that has been subjected to a rubbing treatment may be used.

Examples of the method of applying the polymerizable liquid crystal composition include a curtain coating method, a dip coating method, a spin coating method, a printing coating method, a spray coating method, a slot coating method, a roll coating method, a slide coating method, a blade coating method, a gravure coating method, and a wire bar method.

Next, the formed coating film is subjected to an alignment treatment to align a polymerizable liquid crystal compound in the coating film.

The alignment treatment can be carried out by drying the coating film at room temperature or by heating the coating film. In a case of a thermotropic liquid crystal compound, the liquid crystal phase formed by the alignment treatment can generally be transferred by a change in temperature or pressure. In a case of a lyotropic liquid crystal compound, the liquid crystal phase formed by the alignment treatment can also be transferred by a compositional ratio such as an amount of solvent.

The conditions for heating the coating film are not particularly limited, and the heating temperature is preferably 50° C. to 250° C. and more preferably 50° C. to 150° C., and the heating time is preferably 10 seconds to 10 minutes.

In addition, after the coating film is heated, the coating film may be cooled, if necessary, before a curing treatment (light irradiation treatment) which will be described later. The cooling temperature is preferably 20° C. to 200° C. and more preferably 30° C. to 150° C.

Next, the coating film in which the polymerizable liquid crystal compound is aligned is subjected to a curing treatment.

The method of the curing treatment carried out on the coating film in which the polymerizable liquid crystal compound is aligned is not particularly limited, and examples thereof include a light irradiation treatment and a heat treatment. Above all, from the viewpoint of manufacturing suitability, a light irradiation treatment is preferable, and an ultraviolet irradiation treatment is more preferable.

The irradiation conditions of the light irradiation treatment are not particularly limited, and an irradiation amount of 50 to 1,000 mJ/cm$^2$ is preferable.

The atmosphere during the light irradiation treatment is not particularly limited and is preferably a nitrogen atmosphere.

In the method for producing an optical film, it is preferable to carry out the following steps 1 to 5 in a case of producing the first optically anisotropic layer and the second optically anisotropic layer on the elongated support. By carrying out the following step 1 to step 5, a laminate of the first optically anisotropic layer and the second optically anisotropic layer can be produced in one coating step.

Step 1: a step of applying a polymerizable liquid crystal composition containing a chiral agent including at least a photosensitive chiral agent whose helical twisting power changes upon irradiation with light, and a rod-like liquid crystal compound having a polymerizable group (hereinafter, also simply referred to as "liquid crystal compound" in the description of step 1 to step 5) onto an elongated support to form a composition layer Step 2: a step of subjecting the composition layer to a heat treatment to align the liquid crystal compound in the composition layer Step 3: a step of subjecting the composition layer to light irradiation under a condition of an oxygen concentration of 1% by volume or more, after the step 2

Step 4: a step of subjecting the composition layer to a heat treatment, after the step 3.

Step 5: a step of subjecting the composition layer to a curing treatment to fix an alignment state of the liquid crystal compound to form a first optically anisotropic layer and a second optically anisotropic layer, after the step 4 Hereinafter, the procedure of each of the above steps will be described in detail.

(Step 1)

The step 1 is a step of applying a polymerizable liquid crystal composition containing a chiral agent including at least a photosensitive chiral agent whose helical twisting power changes upon irradiation with light and a liquid crystal compound having a polymerizable group onto an elongated support to form a composition layer. Carrying out this step leads to the formation of a composition layer to be subjected to a light irradiation treatment which will be described later.

The various components contained in the polymerizable liquid crystal composition are as described above, and the photosensitive chiral agent not described above will be described in detail below.

The helical twisting power (HTP) of the chiral agent is a factor indicating a helical alignment ability expressed by Expression (X).

HTP=1/(length(unit: μm) of helical pitch×concentration (% by mass) of chiral agent with respect to liquid crystal compound) [μm$^{-1}$]       Expression (X)

The length of the helical pitch refers to a length of pitch P (=the period of the helix) of a helical structure of the cholesteric liquid crystalline phase and can be measured by the method described in Handbook of Liquid Crystals (published by Maruzen Co., Ltd.), p. 196.

The photosensitive chiral agent whose helical twisting power changes upon irradiation with light (hereinafter, also simply referred to as "chiral agent A") may be liquid crystalline or non-liquid crystalline. The chiral agent A generally contains an asymmetric carbon atom in many cases. The chiral agent A may be an axial asymmetric compound or planar asymmetric compound that does not contain an asymmetric carbon atom.

The chiral agent A may have a polymerizable group.

The chiral agent A may be a chiral agent whose helical twisting power increases upon irradiation with light, or may be a chiral agent whose helical twisting power decreases upon irradiation with light. Of these, a chiral agent whose helical twisting power decreases upon irradiation with light is preferable.

The "increase and decrease in helical twisting power" in the present specification represent increase/decrease in helical twisting power in a case where an initial helical direction (helical direction before light irradiation) of the chiral agent A is set to "positive". Therefore, even in a case where the helical twisting power of a chiral agent continues to decrease and goes below zero upon irradiation with light and therefore the helical direction becomes "negative" (that is, even in a case where a chiral agent induces a helix in a helical direction opposite to an initial helical direction (before light irradiation)), such a chiral agent also corresponds to a "chiral agent whose helical twisting power decreases".

The chiral agent A may be, for example, a so-called photoreactive chiral agent. The photoreactive chiral agent is a compound which has a chiral site and a photoreactive site that undergoes a structural change upon irradiation with light and which greatly changes a twisting power of a liquid crystal compound according to an irradiation amount, for example.

Above all, the chiral agent A is preferably a compound having at least a photoisomerization site, and the photoisomerization site more preferably has a photoisomerizable double bond. The photoisomerization site having a photoisomerizable double bond is preferably a cinnamoyl site, a chalcone site, an azobenzene site, or a stilbene site from the viewpoint that photoisomerization is likely to occur and the difference in helical twisting power before and after light irradiation is large; and more preferably a cinnamoyl site, a chalcone site, or a stilbene site from the viewpoint that the absorption of visible light is small. The photoisomerization site corresponds to the above-mentioned photoreactive site that undergoes a structural change upon irradiation with light.

In the step 1, at least the above-mentioned chiral agent A is used. The step 1 may be an aspect in which two or more chiral agents A are used, or may be an aspect in which at least one chiral agent A and at least one chiral agent whose helical twisting power does not change upon irradiation with light (hereinafter, simply referred to as "chiral agent B") are used.

The chiral agent B may be liquid crystalline or non-liquid crystalline. The chiral agent B generally contains an asymmetric carbon atom in many cases. The chiral agent B may be an axial asymmetric compound or planar asymmetric compound that does not contain an asymmetric carbon atom.

The chiral agent B may have a polymerizable group.

A known chiral agent can be used as the chiral agent B.

The chiral agent B is preferably a chiral agent that induces a helix in a direction opposite to the direction of the helix induced by the chiral agent A. That is, for example, in a case where the helix induced by the chiral agent A is right-handed, the helix induced by the chiral agent B is left-handed.

The content of the chiral agent A in the composition layer is not particularly limited, and is preferably 5.0% by mass or less, more preferably 3.0% by mass or less, still more preferably 2.0% by mass or less, particularly preferably less than 1.0% by mass, more particularly preferably 0.8% by mass or less, and most preferably 0.5% by mass or less with respect to the total mass of the liquid crystal compound, from the viewpoint that the liquid crystal compound is easily aligned uniformly. The lower limit thereof is not particularly limited, and is preferably 0.01% by mass or more, more preferably 0.02% by mass or more, and still more preferably 0.05% by mass or more.

The chiral agent A may be used alone or in combination of two or more thereof. In a case where two or more of the chiral agents A are used in combination, the total content thereof is preferably within the above range.

The content of the chiral agent B in the composition layer is not particularly limited, and is preferably 5.0% by mass or less, more preferably 3.0% by mass or less, still more preferably 2.0% by mass or less, particularly preferably less than 1.0% by mass, more particularly preferably 0.8% by mass or less, and most preferably 0.5% by mass or less with respect to the total mass of the liquid crystal compound, from the viewpoint that the liquid crystal compound is easily aligned uniformly. The lower limit thereof is not particularly limited, and is preferably 0.01% by mass or more, more preferably 0.02% by mass or more, and still more preferably 0.05% by mass or more.

The chiral agent B may be used alone or in combination of two or more thereof. In a case where two or more of the chiral agents B are used in combination, the total content thereof is preferably within the above range.

The total content of the chiral agent (total content of all chiral agents) in the composition layer is preferably 5.0% by mass or less, more preferably 4.0% by mass or less, still more preferably 2.0% by mass or less, and particularly preferably 1.0% by mass or less with respect to the total mass of the liquid crystal compound. The lower limit thereof is not particularly limited, and is preferably 0.01% by mass or more, more preferably 0.02% by mass or more, and still more preferably 0.05% by mass or more.

The method of applying the polymerizable liquid crystal composition to form the composition layer is not particularly limited, and may be, for example, a method of applying the above-mentioned polymerizable liquid crystal composition.

The film thickness of the composition layer is not particularly limited and is preferably 0.1 to 20 μm, more preferably 0.2 to 15 μm, and still more preferably 0.5 to 10 μm.

(Step 2)

The step 2 is a step of subjecting the composition layer to a heat treatment to align the liquid crystal compound in the composition layer. Carrying out this step brings the liquid crystal compound in the composition layer into a predetermined alignment state.

With regard to heat treatment conditions, the optimum conditions are selected according to the liquid crystal compound used.

Above all, the heating temperature is often 10° C. to 250° C., more often 40° C. to 150° C., and still more often 50° C. to 130° C.

The heating time is often 0.1 to 60 minutes and more often 0.2 to 5 minutes.

The absolute value of the weighted average helical twisting power of the chiral agent in the composition layer formed by the step 1 is preferably 0.0 to 1.9 $\mu m^{-1}$, more preferably 0.0 to 1.5 $\mu m^{-1}$, still more preferably 0.0 to 1.0 $\mu m^{-1}$, particularly preferably 0.0 to 0.5 $\mu m^{-1}$, and most preferably zero.

The weighted average helical twisting power of the chiral agent is a total value obtained by dividing the product of a helical twisting power of each chiral agent contained in the composition layer and a concentration (% by mass) of each chiral agent in the composition layer by a total concentration (% by mass) of the chiral agents in the composition layer, in a case where two or more chiral agents are contained in the composition layer. The weighted average helical twisting power is represented by Expression (Y), for example, in a case where two chiral agents (chiral agent X and chiral agent Y) are used in combination.

Weighted average helical twisting power ($\mu m^{-}$)=
(helical twisting power ($\mu m^{-1}$) of chiral agent
X×concentration (% by mass) of chiral agent X
in composition layer+helical twisting power
($\mu m^{-1}$) of chiral agent Y×concentration (% by
mass) of chiral agent Y in composition layer)/
(concentration (% by mass) of chiral agent X in
composition layer+concentration (% by mass)
of chiral agent Y in composition layer)    Expression (Y)

However, in Expression (Y), in a case where the helical direction of the chiral agent is dextrorotatory, the helical twisting power has a positive value. In addition, in a case where the helical direction of the chiral agent is levorotatory, the helical twisting power has a negative value. That is, for example, in a case of a chiral agent having a helical twisting power of 10 $\mu m^{-1}$, the helical twisting power is expressed as 10 $\mu m^{-1}$ in a case where the helical direction of the helix induced by the chiral agent is dextrorotatory. On the other hand, in a case where the helical direction of the helix induced by the chiral agent is levorotatory, the helical twisting power is expressed as −10 $\mu m^{-1}$.

Figure 7:
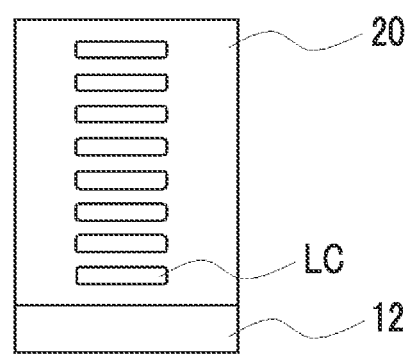
FIG. 7 is a cross-sectional view of a composition layer for explaining a step 1.

In a case where the absolute value of the weighted average helical twisting power of the chiral agent in the composition layer formed in the step 1 is 0, a composition layer 20 in which a liquid crystal compound LC is homogeneously aligned is formed on the elongated support 12, as shown in FIG. 7. It should be noted that FIG. 7 is a schematic cross-sectional view of the elongated support 12 and the composition layer 20. It is assumed that the chiral agent A and the chiral agent B are present in the composition layer 20 shown in FIG. 7 at the same concentration, the helical direction induced by the chiral agent A is levorotatory, and the helical direction induced by the chiral agent B is dextrorotatory. In addition, the absolute value of the helical twisting power of the chiral agent A and the absolute value of the helical twisting power of the chiral agent B are assumed to be the same.

(Step 3)

The step 3 is a step of subjecting the composition layer to light irradiation in the presence of oxygen, after the step 2. In the following, the mechanism of this step will be described with reference to the accompanying drawings.

Figure 8:
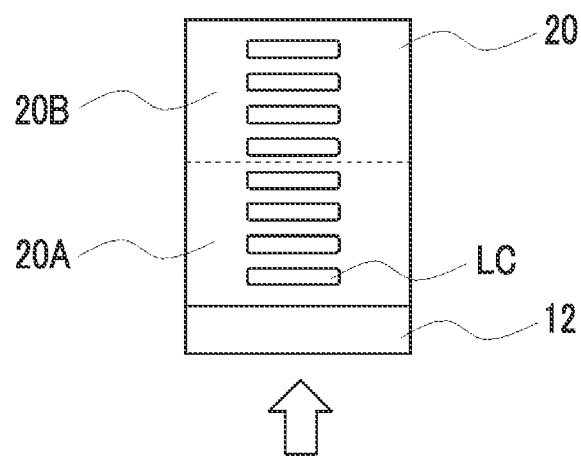
FIG. 8 is a cross-sectional view of a composition layer for explaining a step 2.

As shown in FIG. 8, in the above-mentioned step 2, light irradiation is carried out from the direction opposite to the composition layer 20 side of the elongated support 12 (the direction of the white arrow in FIG. 8) under the condition that the oxygen concentration is 1% by volume or more. Although the light irradiation is carried out from the elongated support 12 side in FIG. 8, the light irradiation may be carried out from the composition layer 20 side.

At that time, in a case where a lower region 20A of the composition layer 20 on the elongated support 12 side and an upper region 20B on the side opposite to the elongated support 12 side are compared, the surface of the upper region 20B is on the air side, so that the oxygen concentration in the upper region 20B is high and the oxygen concentration in the lower region 20A is low. Therefore, in a case where the composition layer 20 is irradiated with light, the polymerization of the liquid crystal compound easily proceeds in the lower region 20A, and the alignment state of the liquid crystal compound is fixed. The chiral agent A is also present in the lower region 20A, and the chiral agent A is also exposed to light and therefore the helical twisting power changes. However, since the alignment state of the liquid crystal compound is fixed in the lower region 20A, there is no change in the alignment state of the liquid crystal compound even in a case where the step 4 of subjecting the light-irradiated composition layer to a heat treatment, which will be described later, is carried out.

In addition, since the oxygen concentration is high in the upper region 20B, the polymerization of the liquid crystal compound is inhibited by oxygen and therefore the polymerization does not proceed easily even in a case where light irradiation is carried out. Since the chiral agent A is also present in the upper region 20B, the chiral agent A is exposed to light and therefore the helical twisting power changes. Therefore, in a case where the step 4 (heat treatment) which will be described later is carried out, the alignment state of the liquid crystal compound changes along with the changed helical twisting power.

That is, the immobilization of the alignment state of the liquid crystal compound is likely to proceed in the substrate-side region (lower region) of the composition layer by carrying out the step 3. In addition, the immobilization of the alignment state of the liquid crystal compound is difficult to proceed in the region of the composition layer (upper region) opposite to the substrate side, and the helical twisting power changes according to the exposed chiral agent A.

The step 3 is carried out under the condition that the oxygen concentration is 1% by volume or more. Above all, the oxygen concentration is preferably 2% by volume or more and more preferably 5% by volume or more from the viewpoint that regions having different alignment states of the liquid crystal compound are likely to be formed in the optically anisotropic layer. The upper limit thereof is not particularly limited and may be, for example, 100% by volume.

The irradiation intensity of the light irradiation in the step 3 is not particularly limited and can be appropriately determined based on the helical twisting power of the chiral agent A. The irradiation amount of light irradiation in the step 3 is not particularly limited, and is preferably 300 mJ/cm$^2$ or less and more preferably 200 mJ/cm$^2$ or less from the viewpoint that a predetermined optically anisotropic layer is easily formed. The lower limit thereof is preferably 5 mJ/cm$^2$ or more and more preferably 10 mJ/cm$^2$ or more from the viewpoint that a predetermined optically anisotropic layer is easily formed.

The light irradiation in the step 3 is preferably carried out at 15° C. to 70° C. (preferably 15° C. to 50° C.).

The light used for the light irradiation may be any light that the chiral agent A is exposed to. That is, the light used for the light irradiation is not particularly limited as long as it is an actinic ray or radiation that changes the helical twisting power of the chiral agent A, and examples thereof include an emission line spectrum of a mercury lamp, a far ultraviolet ray represented by an excimer laser, an extreme ultraviolet ray, an X-ray, an ultraviolet ray, and an electron beam. Of these, an ultraviolet ray is preferable.

(Step 4)

The step 4 is a step of subjecting the composition layer to a heat treatment, after the step 3. Carrying out this step leads to a change in the alignment state of the liquid crystal compound in the region where the helical twisting power of the chiral agent A in the composition layer subjected to light irradiation changes.

In the following, the mechanism of this step will be described with reference to the accompanying drawings.

As described above, in a case where the step 3 is carried out on the composition layer 20 shown in FIG. 7, the alignment state of the liquid crystal compound is fixed in the lower region 20A, whereas the polymerization of the liquid crystal compound is difficult to proceed and the alignment state of the liquid crystal compound is not fixed in the upper region 20B. In addition, the helical twisting power of the chiral agent A changes in the upper region 20B. In a case where such a change in the helical twisting power of the chiral agent A occurs, the force of twisting the liquid crystal compound changes in the upper region 20B, as compared with the state before light irradiation. This point will be described in more detail.

As described above, the chiral agent A and the chiral agent B are present in the composition layer 20 shown in FIG. 7 at the same concentration, the helical direction induced by the chiral agent A is levorotatory, and the helical direction induced by the chiral agent B is dextrorotatory. In addition, the absolute value of the helical twisting power of the chiral agent A and the absolute value of the helical twisting power of the chiral agent B are the same. Therefore, the weighted average helical twisting power of the chiral agent in the composition layer before light irradiation is zero.

Figure 9:
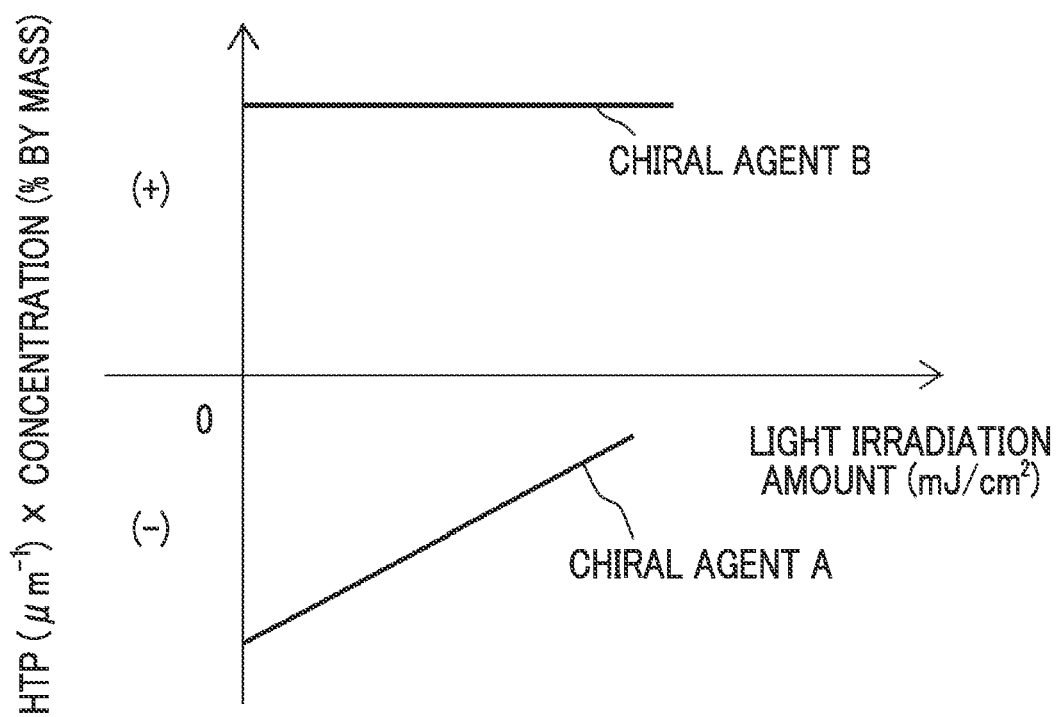
FIG. 9 is a schematic diagram of a graph plotting a relationship between a helical twisting power (HTP) ($\mu m^{-1}$)×a concentration (% by mass) and a light irradiation amount ($mJ/cm^2$) for each of chiral agent A and chiral agent B.

The above aspect is shown in FIG. 9. In addition, in FIG. 9, the vertical axis represents the "helical twisting power ($\mu m^{-1}$) of chiral agent×concentration (% by mass) of chiral agent", and the helical twisting power increases as the value thereof deviates from zero. The lateral axis represents the "light irradiation amount ($mJ/cm^2$)".

First, the relationship between the chiral agent A and the chiral agent B in the composition layer before light irradiation corresponds to the time in a case where the light irradiation amount is zero, and therefore corresponds to a state in which the absolute value of "helical twisting power ($\mu m^{-1}$) of chiral agent A×concentration (% by mass) of chiral agent A" and the absolute value of "helical twisting power ($\mu m^{-1}$) of chiral agent B×concentration (% by mass) of chiral agent B" are equal. That is, the helical twisting powers of both the chiral agent A that induces levorotatory turning and the chiral agent B that induces dextrorotatory turning are offset.

Figure 10:
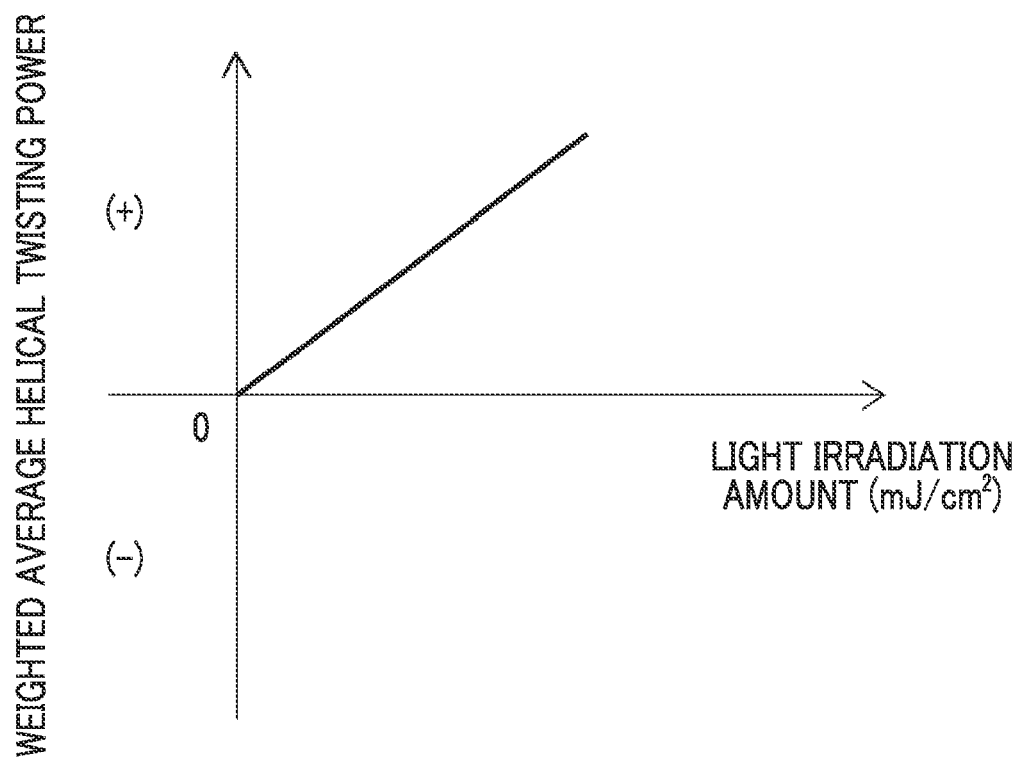
FIG. 10 is a schematic diagram of a graph plotting a relationship between a weighted average helical twisting power ($\mu m^{-}$) and a light irradiation amount ($mJ/cm^2$) in a system in which chiral agent A and chiral agent B are used in combination.

In a case where light irradiation is carried out in the upper region 20B in such a state and the helical twisting power of the chiral agent A decreases with the light irradiation amount as shown in FIG. 9, the weighted average helical twisting power of the chiral agent in the upper region 20B becomes large and therefore the dextrorotatory helical twisting power becomes strong, as shown in FIG. 10. That is, as for the helical twisting power that induces the helix of the liquid crystal compound, an increase in the irradiation amount leads to an increase in the helical twisting power in the direction (+) of the helix induced by the chiral agent B.

Figure 11:
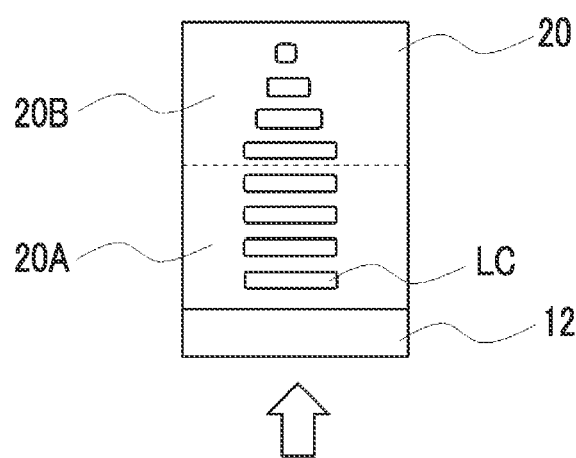
FIG. 11 is a cross-sectional view of a composition layer for explaining a case where a step 5 is carried out.

Therefore, in a case where the composition layer 20 after the step 3 in which such a change in the weighted average helical twisting power occurred is subjected to a heat treatment to promote the realignment of the liquid crystal compound, the liquid crystal compound LC is twist-aligned along a helical axis extending along the thickness direction of the composition layer 20 in the upper region 20B, as shown in FIG. 11.

On the other hand, as described above, the polymerization of the liquid crystal compound proceeds to fix the alignment state of the liquid crystal compound during the step 3 in the lower region 20A of the composition layer 20, so that the realignment of the liquid crystal compound does not proceed.

As described above, carrying out the step 4 leads to the formation of a plurality of regions having different alignment states of the liquid crystal compound along the thickness direction of the composition layer.

The degree of twist of the liquid crystal compound LC can be appropriately adjusted depending on the type of chiral agent A used, the exposure amount in the step 3, and the like, and therefore the twist angle of the second optically anisotropic layer which will be described later can be achieved.

The aspect in which a chiral agent whose helical twisting power decreases upon irradiation with light is used as the chiral agent A has been described in FIGS. 9 and 10, but the present invention is not limited to this aspect. For example, a chiral agent whose helical twisting power increases upon irradiation with light may be used as the chiral agent A. In that case, the helical twisting power induced by the chiral agent A increases upon irradiation with light and therefore the liquid crystal compound is twist-aligned in the turning direction induced by the chiral agent A.

In addition, the aspect in which chiral agent A and the chiral agent B are used in combination has been described in FIGS. 9 and 10, but the present invention is not limited to this aspect. For example, it may be an aspect in which two types of chiral agents A are used. Specifically, it may be an aspect in which a chiral agent A1 that induces levorotatory turning and a chiral agent A2 that induces dextrorotatory turning are used in combination. The chiral agents A1 and A2 may be each independently a chiral agent whose helical twisting power increases or a chiral agent whose helical twisting power decreases. For example, a chiral agent that induces levorotatory turning and whose helical twisting power increases upon irradiation with light and a chiral agent that induces dextrorotatory turning and whose helical twisting power decreases upon irradiation with light may be used in combination.

With regard to heat treatment conditions, the optimum conditions are selected according to the liquid crystal compound used.

Above all, the heating temperature is preferably a temperature for heating from the state of the step 3, often 35° C. to 250° C., more often 50° C. to 150° C., still more often higher than 50° C. and 150° C. or lower, and particularly often 60° C. to 130° C. The heating time is often 0.01 to 60 minutes and more often 0.03 to 5 minutes.

In addition, the absolute value of the weighted average helical twisting power of the chiral agent in the composition layer after light irradiation is not particularly limited, and the absolute value of the difference between the weighted average helical twisting power of the chiral agent in the composition layer after light irradiation and the weighted average helical twisting power of the chiral agent in the composition layer before light irradiation is preferably 0.05 µm$^{-1}$ or more, more preferably 0.05 to 10.0 µm$^{-1}$, and still more preferably 0.1 to 10.0 µm$^{-1}$.

(Step 5)

The step 5 is a step of subjecting the composition layer to a curing treatment to fix an alignment state of the liquid crystal compound to form a first optically anisotropic layer and a second optically anisotropic layer, after the step 4. By carrying out this step, the alignment state of the liquid crystal compound in the composition layer is fixed, and as a result, a predetermined optically anisotropic layer is formed.

The method of the curing treatment is not particularly limited, and examples thereof include a photocuring treatment and a thermal curing treatment. Above all, a light irradiation treatment is preferable, and an ultraviolet irradiation treatment is more preferable.

For ultraviolet irradiation, a light source such as an ultraviolet lamp is used.

The irradiation amount of light (for example, ultraviolet rays) is not particularly limited, and is generally preferably about 100 to 800 mJ/cm$^2$.

<Circularly Polarizing Plate>

The above-mentioned optical film may be used as a circularly polarizing plate in combination with a polarizer.

Figure 12:
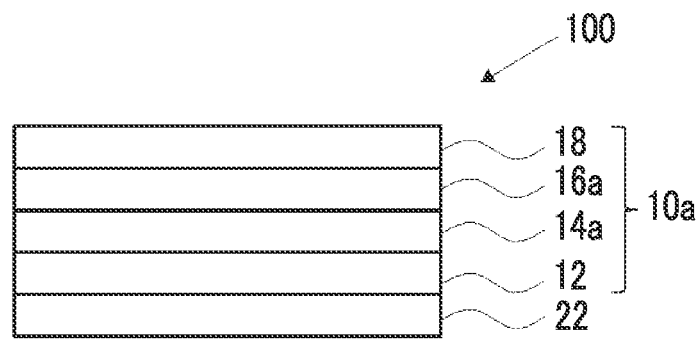
FIG. 12 is an example of a schematic cross-sectional view of an embodiment of a circularly polarizing plate of the present invention.

As one embodiment of the circularly polarizing plate, a circularly polarizing plate 100 according to the embodiment of the present invention includes a polarizer 22 and an optical film 10a, as shown in FIG. 12. The polarizer 22 is disposed on the side of the elongated support 12 of the optical film 10a opposite to the first optically anisotropic layer 14a side.

It is preferable that the absorption axis of the polarizer and the longitudinal direction of the elongated support are parallel to each other. That is, the angle formed by the absorption axis of the polarizer and the longitudinal direction of the elongated support is preferably 0° to 10°.

As mentioned above, the absorption axis of the polarizer is usually likely to be located in a longitudinal direction. Therefore, in a case of bonding the polarizer and the elongated support such that the absorption axis of the polarizer and the longitudinal direction of the elongated support are parallel to each other, a desired circularly polarizing plate can be prepared by continuously bonding the polarizer and the elongated support by roll-to-roll processing so as to be along the longitudinal directions of both.

Although the optical film 10a is used in FIG. 12, the above-mentioned optical film 10b may be used.

The polarizer may be a member having a function of converting natural light into specific linearly polarized light, and examples thereof include an absorption type polarizer.

The type of the polarizer is not particularly limited, and a commonly used polarizer can be used. Examples of the polarizer include an iodine-based polarizer, a dye-based polarizer using a dichroic dye, and a polyene-based polarizer. The iodine-based polarizer and the dye-based polarizer are generally prepared by adsorbing iodine or a dichroic dye on a polyvinyl alcohol, followed by stretching.

A protective film may be disposed on one side or both sides of the polarizer.

The method for producing a circularly polarizing plate is not particularly limited, and a known method can be adopted.

For example, there is a method of bonding an optical film and a polarizer through an adhesive layer.

<Organic EL Display Device>

The organic EL display device according to the embodiment of the present invention has the above-mentioned optical film (or circularly polarizing plate). Usually, the circularly polarizing plate is provided on an organic EL display panel of the organic EL display device. That is, the organic EL display device according to the embodiment of the present invention has an organic EL display panel and the above-mentioned circularly polarizing plate.

Figure 13:
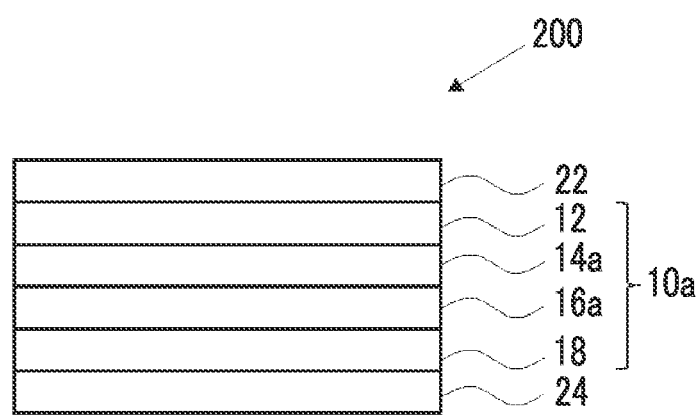
FIG. 13 is an example of a schematic cross-sectional view of an embodiment of an organic electroluminescence display device of the present invention.

As an example of the organic EL display device, an organic EL display device 200 has an organic EL display panel 24, an optical film 10a, and a polarizer 22 in this order, as shown in FIG. 13. As shown in FIG. 13, the polarizer 22 is disposed on the outermost side.

Although the optical film 10a is used in FIG. 13, the above-mentioned optical film 10b may be used.

The organic EL display panel 24 is a member in which a light emitting layer or a plurality of organic compound thin films including a light emitting layer are formed between a pair of electrodes of an anode and a cathode, and may have a hole injection layer, a hole transport layer, an electron injection layer, an electron transport layer, a protective layer, and the like in which each of these layers may have other functions, in addition to the light emitting layer. Various materials can be used to form each layer.

EXAMPLES

Hereinafter, features of the present invention will be described more specifically with reference to Examples and Comparative Examples. The materials, amounts used, proportions, treatment details, and treatment procedure shown in the following Examples can be appropriately changed without departing from the spirit and scope of the present invention. Accordingly, the scope of the present invention should not be construed as being limited by the specific examples given below.

<Preparation of Supports 1 and 2>

The following components were charged into a mixing tank and stirred while heating to prepare a cellulose acylate solution 1.

| Cellulose acylate solution 1 | |
| --- | --- |
| Cellulose acylate having an acetylation degree of 60.7% to 61.1% | 100 parts by mass |
| Triphenylphosphine (plasticizer) | 7.8 parts by mass |
| Biphenyl diphenyl phosphate (plasticizer) | 3.9 parts by mass |
| Methylene chloride (first solvent) | 336 parts by mass |
| Methanol (second solvent) | 29 parts by mass |
| 1-Butanol (third solvent) | 11 parts by mass |

A retardation enhancer (16 parts by mass) shown below, methylene chloride (92 parts by mass), and methanol (8 parts by mass) were charged into another mixing tank and stirred while heating to prepare a retardation enhancer solution.

The retardation enhancer solution (25 parts by mass) was mixed with the cellulose acylate solution 1 (474 parts by mass), and the mixture was sufficiently stirred to prepare a dope. The amount of the retardation enhancer added was 6.0 parts by mass with respect to 100 parts by mass of the cellulose acylate.

Retardation Enhancer

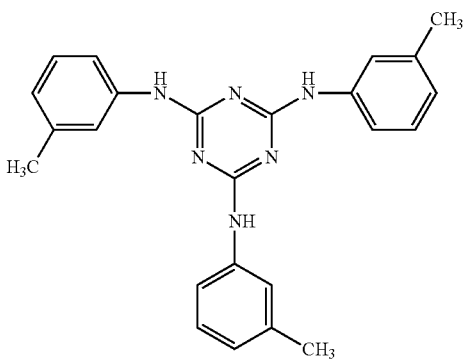 [SMILES: Cc1cccc(Nc2nc(Nc3cccc(C)c3)nc(Nc3cccc(C)c3)n2)c1]

The obtained dope was cast using a band drawing machine. After the film surface temperature on the band reached 40° C., the film was peeled off from the band, and the obtained film was dried with hot air at 70° C. for 1 minute and then further dried with drying air at 140° C. for 10 minutes to obtain a cellulose acylate film.

At that time, the film thickness of the obtained cellulose acylate film was adjusted to prepare supports 1 and 2 which will be described later.

<Preparation of Supports 3 and 4>

A cellulose acylate having a total degree of substitution of 2.97 (breakdown: acetyl substitution degree of 0.45, propionyl substitution degree of 2.52) was prepared.

Specifically, a mixture of sulfuric acid (7.8 parts by mass with respect to 100 parts by mass of cellulose) and carboxylic acid anhydride as a catalyst was cooled to −20° C. and added to pulp-derived cellulose which was then subjected to acylation at 40° C. At this time, the type of acyl group and its substitution ratio were adjusted by adjusting the type and amount of the carboxylic acid anhydride. In addition, after acylation, aging was carried out at 40° C. to adjust the total degree of substitution.

The cellulose acylate prepared above was heated to 120° C. and dried to have a moisture content of 0.5% by mass or less.

A solvent and additives were charged into a stainless steel dissolution tank to which the cellulose acylate was then gradually added while stirring. After the charging was completed, the mixture was stirred at room temperature for 2 hours, further swollen for 3 hours, and then stirred again to obtain a mixed solution.

A mixed solvent of dichloromethane/methanol/butanol (81/15/4 parts by mass) was used as the solvent. The moisture content of the mixed solvent was 0.2% by mass or less. In addition, the amount of the solvent used was 100 parts by mass.

In addition, 0.9 parts by mass of trimethylolpropane triacetate and 0.25 parts by mass of silicon dioxide fine particles (particle size: 20 nm, Mohs hardness: about 7) were used as the additives.

In addition, the amount of the cellulose acylate used was 30 parts by mass.

The stirring was carried out using a dissolver type eccentric stirring shaft that stirs at a circumferential speed of 15 m/sec (shear stress: $5 \times 10^4$ kgf/m/sec$^2$) and a stirring shaft that has an anchor blade on the central shaft and stirs at a circumferential speed of 1 m/sec (shear stress: $1 \times 10^4$ kgf/m/sec$^2$). The swelling was carried out by stopping the eccentric stirring shaft and setting the circumferential speed of the stirring shaft having an anchor blade to 0.5 m/sec.

The mixed solution obtained above was filtered through a filter paper (#63, manufactured by Toyo Roshi Kaisha, Ltd.) having an absolute filtration precision of 0.01 mm, and further filtered through a filter paper (FH025, manufactured by Pall Company) having an absolute filtration precision of 2.5 μm to obtain a cellulose acylate solution 2.

The cellulose acylate solution 2 was heated to 30° C. and cast on a mirror finished stainless steel support having a band length of 60 m and set at 15° C. through a casting geeser (as described in JP1999-314233A (JP-H11-314233A)). The casting speed was 15 m/min and the coating width was 200 cm. The space temperature of the entire casting portion was set to 15° C.

Then, 50 cm before the casting portion, the cellulose acylate film that had been cast and rotated was peeled off from the band, and a drying air at 45° C. was blown.

Next, the obtained film was dried at 110° C. for 5 minutes and further dried at 140° C. for 10 minutes to obtain a cellulose acylate film.

The film thickness of the obtained cellulose acylate film was adjusted to prepare supports 3 and 4 which will be described later.

The characteristics of the supports 1 to 4 prepared above are shown below.

TABLE 1

|  | Rth(550) | Re(550) | Film thickness |
| --- | --- | --- | --- |
| Support 1 | 80 nm | 2 nm | 85 μm |
| Support 2 | 60 nm | 1 nm | 55 μm |
| Support 3 | −40 nm | 1 nm | 50 μm |
| Support 4 | −60 nm | 2 nm | 81 μm |

Example 1

(Preparation of Elongated Support)

The following components were charged into a mixing tank and stirred to prepare a cellulose acetate solution to be used as a core layer cellulose acylate dope.

| Core layer cellulose acylate dope | |
| --- | --- |
| Cellulose acetate having an acetyl substitution degree of 2.88 | 100 parts by mass |
| Polyester A | 12 parts by mass |
| Methylene chloride (first solvent) | 430 parts by mass |
| Methanol (second solvent) | 64 parts by mass |

Polyester A described in [Table 1] of JP2015-227956A was used as the polyester A.

10 parts by mass of the following matte agent solution were added to 90 parts by mass of the core layer cellulose acylate dope to prepare a cellulose acetate solution to be used as an outer layer cellulose acylate dope.

| Matte agent solution | |
| --- | --- |
| Silica particles having an average particle size of 20 nm (AEROSIL R972, manufactured by Nippon Aerosil Co., Ltd.) | 2 parts by mass |
| Methylene chloride (first solvent) | 76 parts by mass |
| Methanol (second solvent) | 11 parts by mass |
| Core layer cellulose acylate dope | 1 part by mass |

After filtering the core layer cellulose acylate dope and the outer layer cellulose acylate dope through a filter paper having an average pore diameter of 34 µm and a sintered metal filter having an average pore diameter of 10 µm, the core layer cellulose acylate dope and the outer layer cellulose acylate dope provided on both sides thereof were simultaneously cast in three layers on a drum at 20° C. from a casting port using a band casting machine.

Next, the film on the drum was peeled off with a solvent content of about 20% by mass, both ends of the film in a width direction were fixed with tenter clips, and the film was dried while being stretched in a transverse direction at a stretching ratio of 1.1 times.

Then, the obtained film was transported between rolls of a heat treatment apparatus to be further dried to prepare a cellulose film having a thickness of 20 µm, which corresponds to the elongated support.

The thickness of the core layer in the prepared cellulose film was 15 µm, and the thickness of each of the outer layers disposed on both sides of the core layer was 2.5 µm.

(Formation of First Optically Anisotropic Layer and Second Optically Anisotropic Layer)

The surface of the cellulose film prepared above was subjected to continuously a rubbing treatment by a roll-to-roll method. At this time, the longitudinal direction and the transport direction of the elongated cellulose film were parallel to each other, and the rubbing direction with respect to the longitudinal direction of the film was adjusted to be −14°.

The angle in a rubbing direction is represented by a positive angle value in a counterclockwise direction and a negative angle value in a clockwise direction, assuming that the longitudinal direction of the support is defined as a reference of 0°, upon observing the cellulose film from the surface side on which the optically anisotropic layer which will be described later is laminated.

Using the rubbing-treated cellulose film as a substrate, a composition (1) for forming an optically anisotropic layer containing a rod-like liquid crystal compound having the following composition was applied using a geeser coating machine to form a composition layer (corresponding to a step 1).

Next, the obtained composition layer was heated at 80° C. for 60 seconds (corresponding to a step 2). This heating resulted in alignment of the rod-like liquid crystal compound of the composition layer in a predetermined direction.

Then, the composition layer was irradiated (70 mJ/cm$^2$) with ultraviolet rays using a 365 nm LED lamp (manufactured by AcroEdge Co., Ltd.) at 30° C. under oxygen-containing air (oxygen concentration: about 20% by volume) (corresponding to a step 3).

Subsequently, the obtained composition layer was heated at 80° C. for 10 seconds (corresponding to a step 4).

This was followed by nitrogen purging, and then the composition layer was irradiated (500 mJ/cm$^2$) with ultraviolet rays using a metal halide lamp (manufactured by Eye Graphics Co., Ltd.) at 80° C. with an oxygen concentration of 100 ppm by volume to form an optically anisotropic layer in which the alignment state of the liquid crystal compound was fixed (corresponding to a step 5). An optical film (F1A) was prepared in this manner.

The photopolymerization initiator (Irgacure 907) had almost no absorption at 365 nm (molar absorption coefficient: 140), and a molar absorption coefficient of 18,600 at an absorption peak wavelength of 306 nm.

| Composition (1) for forming optically anisotropic layer | |
|---|---|
| Rod-like liquid crystal compound (A) given below | 100 parts by mass |
| Ethylene oxide-modified trimethylolpropane triacrylate (V# 360, manufactured by Osaka Organic Chemical Industry Ltd.) | 4 parts by mass 6 parts by mass |
| Photopolymerization initiator (Irgacure 907, manufactured by BASF SE) | 0.32 parts by mass |
| Left-twisted chiral agent (L1) given below | |
| Right-twisted chiral agent (R1) given below | 0.11 parts by mass |
| Polymerizable monomer (A) given below | 5 parts by mass |
| Polymerizable monomer (B) given below | 5 parts by mass |
| Polymer (A) given below | 0.25 parts by mass |
| Polymer (B) given below | 0.10 parts by mass |
| Butyl acetate | 325 parts by mass |

Rod-like liquid crystal compound (A) (corresponds to a mixture of compounds hereinafter, in which the numerical value (%) represents the content (% by mass) of each compound in the mixture).

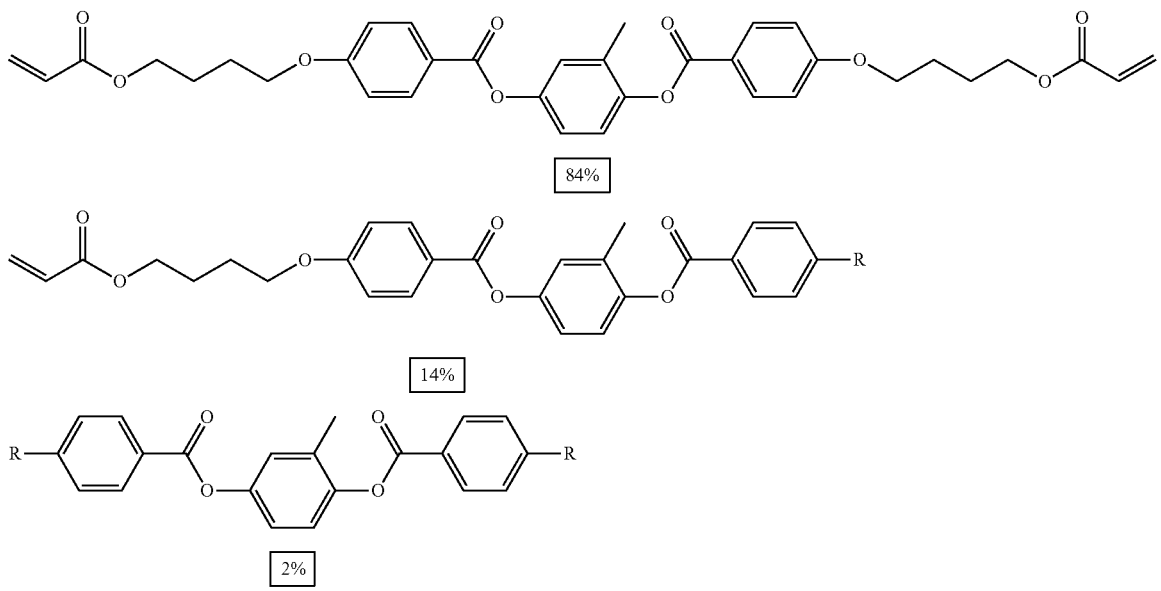

R: 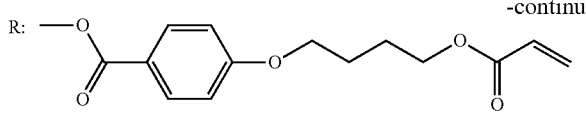

Left-Twisted Chiral Agent (L1)

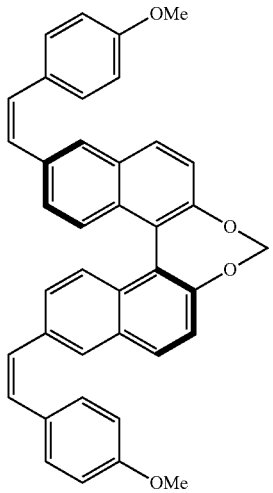

Right-Twisted Chiral Agent (R1)

Polymer (A) (In the formula, the numerical value described in each repeating unit represents the content (% by mass) of each repeating unit with respect to all the repeating units).

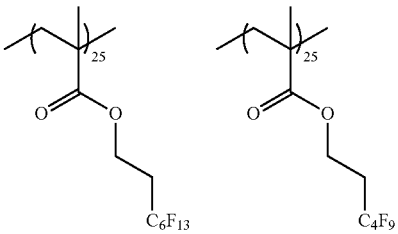

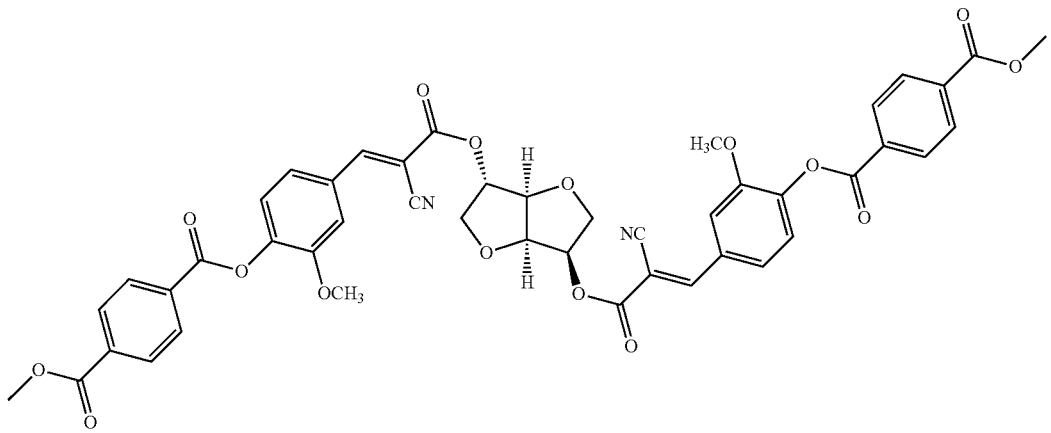

Polymerizable Monomer (A)

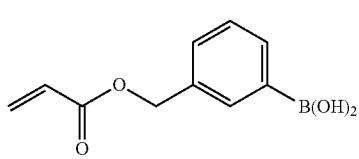

Polymerizable Monomer (B)

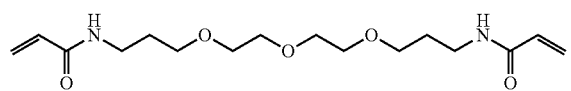 [SMILES: C=CC(=O)NCCCOCCOCCOCCCNC(=O)C=C]

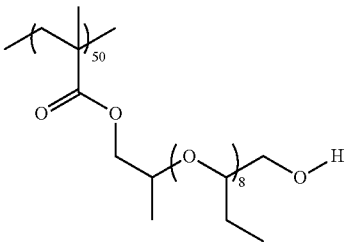

Polymer (B) (In the formula, the numerical value described in each repeating unit represents the content (% by mass) of each repeating unit with respect to all the repeating units).

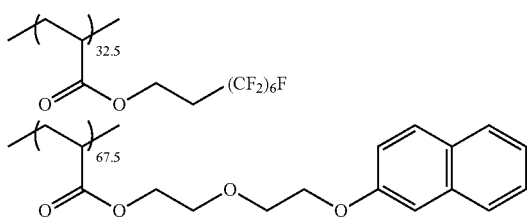

The above prepared optical film (F1A) was cut in parallel with the rubbing direction, and the optically anisotropic layer was observed from the cross-sectional direction with a polarization microscope. The thickness of the optically anisotropic layer was 2.2 μm, the region having a thickness of 1.1 μm (corresponding to the first optically anisotropic layer) on the optically anisotropic layer on the substrate side had a homogeneous alignment, and the region having a thickness of 1.1 μm (corresponding to the second optically anisotropic layer) on the air side of the optically anisotropic layer (side opposite to the substrate) had a twisted alignment of the liquid crystal compound.

The in-plane retardation of the first optically anisotropic layer at a wavelength of 550 nm was 168 nm, the twist angle of the liquid crystal compound was 0°, and the alignment axis angle of the liquid crystal compound with respect to the elongated longitudinal direction was −14° on the side in contact with the substrate and −14° on the side in contact with the second optically anisotropic layer.

In addition, the Δnd of the second optically anisotropic layer was 164 nm, the twist angle of the liquid crystal compound was 82°, and the alignment axis angle of liquid crystal compound with respect to the elongated longitudinal direction was −14° on the side in contact with the first optically anisotropic layer and −96° on the air side.

The alignment axis angle of the liquid crystal compound contained in the optically anisotropic layer is expressed as negative in a case where it is clockwise (right-hand turning) and positive in a case where it is counterclockwise (left-hand turning) with the longitudinal direction of the substrate as a reference of 0°, upon observing the substrate from the surface side of the optically anisotropic layer.

In addition, the twist angle of the liquid crystal compound is expressed as negative in a case where the alignment axis direction of the liquid crystal compound on the substrate side (back side) is clockwise (right-hand turning) and as positive in a case where it is counterclockwise (left-hand turning), with reference to the alignment axis direction of the liquid crystal compound on the surface side (front side), upon observing the substrate from the surface side of the optically anisotropic layer.

(Preparation of Polarizer)

A polyvinyl alcohol film having a thickness of 80 μm was dyed by immersing it in an iodine aqueous solution having an iodine concentration of 0.05% by mass at 30° C. for 60 seconds. Next, the obtained film was machine-direction stretched 5 times its original length while immersed in a boric acid aqueous solution having a boric acid concentration of 4% by mass for 60 seconds, and then dried at 50° C. for 4 minutes to obtain a polarizer having a thickness of 20 μm.

(Preparation of Polarizer Protective Film)

A commercially available cellulose acylate-based film FUJITAC TG40UL (manufactured by FUJIFILM Corporation) was prepared and immersed at 1.5 mol/liter in a sodium hydroxide aqueous solution at 55° C., and then the sodium hydroxide was thoroughly washed away with water. Thereafter, the obtained film was immersed at 0.005 mol/liter in a dilute sulfuric acid aqueous solution at 35° C. for 1 minute, and then immersed in water to thoroughly wash away the dilute sulfuric acid aqueous solution. Finally, the obtained film was sufficiently dried at 120° C. to prepare a polarizer protective film whose surface was subjected to a saponification treatment.

(Preparation of Circularly Polarizing Plate)

The optical film (F1A) prepared above was subjected to a saponification treatment in the same manner as in the preparation of a polarizer protective film described above. Using a polyvinyl alcohol-based adhesive, the above-mentioned polarizer and the above-mentioned polarizer protective film were continuously bonded to the substrate surface contained in the optical film (F1A) by roll-to-roll processing to prepare an elongated circularly polarizing plate (P1A). That is, the circularly polarizing plate (P1A) has a polarizer protective film, a polarizer, a substrate (elongated support), and an optically anisotropic layer (first optically anisotropic layer and second optically anisotropic layer) in this order.

The absorption axis of the polarizer coincided with the longitudinal direction of the circularly polarizing plate, the rotation angle of the in-plane slow axis of the first optically anisotropic layer with respect to the absorption axis of the polarizer was −14°, and the rotation angle of the in-plane slow axis of the surface of the second optically anisotropic layer opposite to the first optically anisotropic layer side with respect to the absorption axis of the polarizer was −96°.

The rotation angle of the in-plane slow axis is represented by a positive angle value in a case where it is counterclockwise and a negative angle value in a case where it is clockwise assuming that the longitudinal direction of the substrate is defined as a reference of 0°, upon observing the polarizer from the optically anisotropic layer side.

(Preparation of Third Optically Anisotropic Layer)

Using the above cellulose acylate film as a substrate, a composition (2) for forming an optically anisotropic layer was applied using a geeser coating machine, and heated with hot air at 40° C. for 60 seconds. This was followed by nitrogen purging, and then the obtained composition layer was irradiated with ultraviolet rays (300 mJ/cm²) using a metal halide lamp (manufactured by Eye Graphics Co., Ltd.) at 40° C. with an oxygen concentration of 100 ppm by volume to fix an alignment state of the liquid crystal compound to form a positive C-plate, whereby an optical film (F1B) having a substrate and a positive C-plate was prepared. The positive C-plate corresponds to the third optically anisotropic layer.

The obtained positive C-plate had an in-plane retardation Re of 0 nm at a wavelength of 550 nm and a thickness direction retardation Rth of −63 nm at a wavelength of 550 nm.

| Composition (2) for forming optically anisotropic layer | |
|---|---|
| Rod-like liquid crystal compound (A) given above | 100 parts by mass |
| Ethylene oxide-modified trimethylolpropane triacrylate (V# 360, manufactured by Osaka Organic Chemical Industry Ltd.) | 8 parts by mass |
| Polymerization initiator (Irgacure 127, manufactured by BASF SE) | 2 parts by mass |
| Polymerization initiator (Irgacure OXE01, manufactured by BASF SE) | 4 parts by mass |
| Onium salt compound (A) given below | 2 parts by mass |
| Polymer (A) given above | 0.3 parts by mass |
| Polymer (C) given below | 0.4 parts by mass |

| Composition (2) for forming optically anisotropic layer | |
|---|---|
| Polymer (D) given below | 5 parts by mass |
| Toluene | 621 parts by mass |
| Methyl ethyl ketone | 69 parts by mass |

Onium salt compound (A)

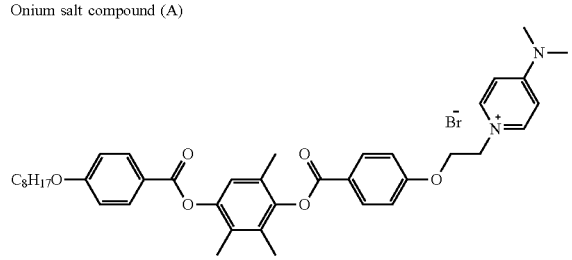

Polymer (C) (In the formula, the numerical value described in each repeating unit represents the content (% by mass) of each repeating unit with respect to all the repeating units).

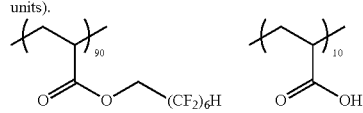

Polymer (D) (In the formula, the numerical value described in each repeating unit represents the content (% by mass) of each repeating unit with respect to all the repeating units).

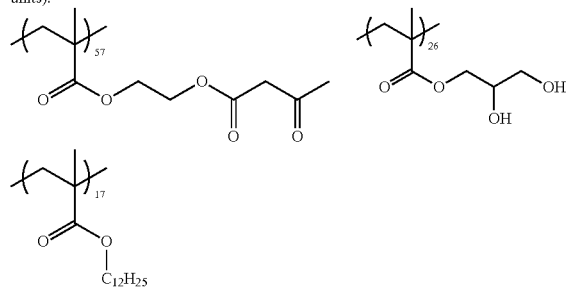

(Preparation of Circularly Polarizing Plate)

A pressure-sensitive adhesive was bonded onto the optically anisotropic layer contained in the above-mentioned circularly polarizing plate (P1A), the positive C-plate contained in the prepared optical film (F1B) was further bonded, and then the substrate contained in the optical film (F1B) was peeled off to prepare an elongated circularly polarizing plate (P1B). That is, the circularly polarizing plate (P1B) has a polarizer protective film, a polarizer, a substrate (elongated support), an optically anisotropic layer (first optically anisotropic layer and second optically anisotropic layer), and a positive C-plate (third optically anisotropic layer) in this order.

Example 2

(Formation of First Optically Anisotropic Layer)

Using the rubbing-treated cellulose film prepared in Example 1 as a substrate, a composition (3) for forming an optically anisotropic layer was applied using a geeser coating machine to form a composition layer. The obtained composition layer was heat-treated with hot air at 110° C. for 2 minutes for drying of the solvent and alignment aging of the rod-like liquid crystal compound. Next, under a nitrogen environment, the obtained composition layer was irradiated with UV (500 mi/cm²) at 80° C. to immobilize the alignment of the liquid crystal compound to form an optically anisotropic layer A corresponding to the first optically anisotropic layer.

The thickness of the optically anisotropic layer A was 1.2 μm. In addition, the Re(550) at 550 nm was 168 nm.

| Composition (3) for forming optically anisotropic layer | |
|---|---|
| Rod-like liquid crystal compound (A) given above | 100 parts by mass |
| Ethylene oxide-modified trimethylolpropane triacrylate (V# 360, manufactured by Osaka Organic Chemical Industry Ltd.) | 4 parts by mass |
| Photopolymerization initiator (Irgacure 907, manufactured by BASF SE) | 6 parts by mass |
| Polymerizable monomer (A) given above | 5 parts by mass |
| Polymerizable monomer (B) given above | 5 parts by mass |
| Polymer (A) given above | 0.25 parts by mass |
| Polymer (B) given above | 0.10 parts by mass |
| Butyl acetate | 325 parts by mass |

(Formation of Second Optically Anisotropic Layer)

A composition (4) for forming an optically anisotropic layer was applied onto the optically anisotropic layer A prepared above with a wire bar without subjecting the optically anisotropic layer A to a rubbing treatment. The film transportation speed (V) was set to 5 m/min. Then, the obtained composition layer was heated with hot air at 110° C. for 2 minutes for drying of the solvent and alignment aging of the disk-like liquid crystal compound. Subsequently, under a nitrogen environment, the obtained composition layer was irradiated with UV (500 mJ/cm) at 80° C. to immobilize the alignment of the liquid crystal compound to form an optically anisotropic layer B corresponding to the second optically anisotropic layer.

The thickness of the optically anisotropic layer B was 1.1 μm. In addition, the Δnd at 550 nm was 164 nm.

The in-plane slow axis of the surface of the optically anisotropic layer B on the optically anisotropic layer A side was parallel to the in-plane slow axis of the optically anisotropic layer A. In addition, the twist angle of the disk-like liquid crystal compound in the optically anisotropic layer B was 82°, and assuming that the longitudinal direction of the support is defined as a reference of 0°, the rotation angle of the in-plane slow axis of the surface of the optically anisotropic layer B opposite to the optically anisotropic layer A side was −96°. That is, the disk-like liquid crystal compound forms a twisted structure in a clockwise direction. An optical film (F2A) was prepared in this manner.

The rotation angle of the in-plane slow axis is represented by a positive angle value in a case where it is counterclockwise and a negative angle value in a case where it is clockwise assuming that the longitudinal direction of the substrate is defined as a reference of 0°, upon observing the substrate from the surface side on which the optically anisotropic layer is laminated.

In addition, the twist angle of the disk-like liquid crystal compound is expressed as negative in a case where the alignment axis direction of the liquid crystal compound on the substrate side (back side) is clockwise (right-hand turning) and positive in a case where it is counterclockwise (left-hand turning) with respect to the in-plane slow axis of the surface of the optically anisotropic layer B opposite to the optically anisotropic layer A side, upon observing the substrate from the surface side on which the optically anisotropic layer is laminated.

| Composition (4) for forming optically anisotropic layer | |
|---|---:|
| Disk-like liquid crystal compound 1 given below | 80 parts by mass |
| Disk-like liquid crystal compound 2 given below | 20 parts by mass |
| Alignment film interface alignment agent 1 given, below | 0.05 parts by mass |
| Chiral agent (FM10524) given below | 0.27 parts by mass |
| Fluorine-containing compound A given below | 0.1 parts by mass |
| Fluorine-containing compound B given below | 0.05 parts by mass |
| Fluorine-containing compound C given below | 0.21 parts by mass |
| Modified trimethylolpropane triacrylate given below | 5 parts by mass |
| Photopolymerization initiator given below (Irgacure 907, manufactured by Ciba Specialty Chemicals Inc.) | 3.0 parts by mass |
| Methyl ethyl ketone | 200 parts by mass |

Disk-like liquid crystal compound 1

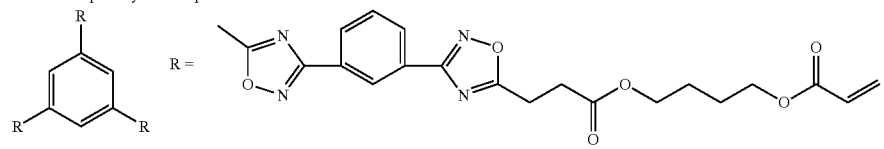

Disk-like liquid crystal compound 2

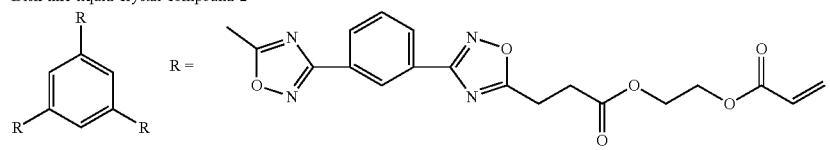

Alignment film interface alignment agent 1

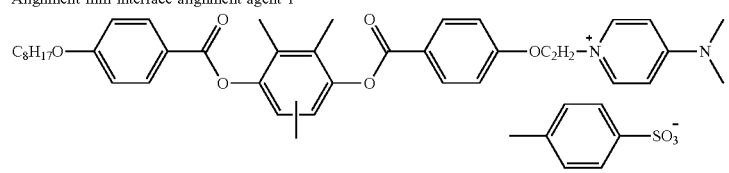

Chiral agent

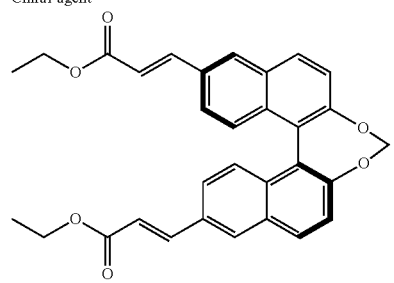

Fluorine-containing compound A

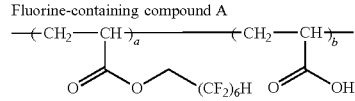

The a and b represent the content (% by mass) of each repeating unit with respect to all the repeating units, a represents 90% by mass, and b represents 10% by mass.

Fluorine-containing compound B (The numerical value in each repeating unit represents the content (% by mass) with respect to all the repeating units, the content of the repeating unit on the left side is 32.5% by mass, and the content of the repeating unit on the right side is 67.5% by mass.)

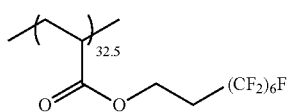

-continued

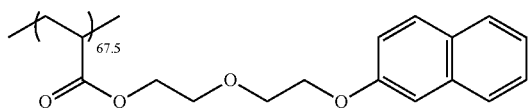

Fluorine-containing compound C (the numerical value in each repeating unit represents the content (% by mass) with respect to all the repeating units, the content of the repeating unit on the left side is 25% by mass, the content of the repeating unit in the middle is 25% by mass, and the content of the repeating unit on the right side is 50% by mass)

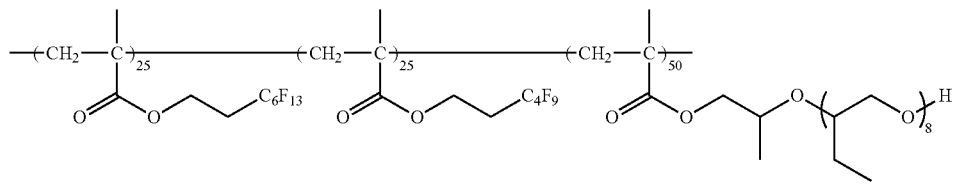

Modified Trimethylolpropane Triacrylate

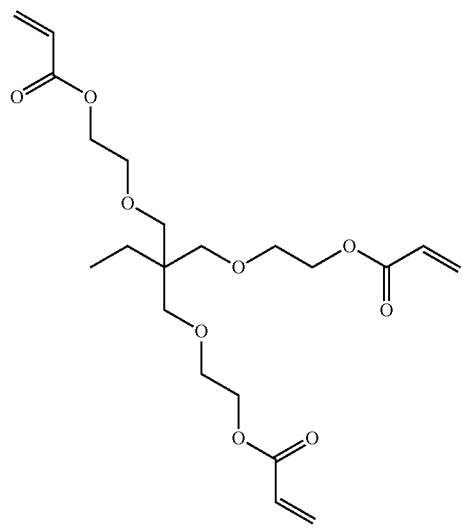 [SMILES: C=CC(=O)OCCOCC(CC)(COCCOC(=O)C=C)COCCOC(=O)C=C]

The optical film (F2A) prepared above was subjected to a saponification treatment in the same manner as in the preparation of the circularly polarizing plate (P1A) described above. Using a polyvinyl alcohol-based adhesive, the above-mentioned polarizer and the above-mentioned polarizer protective film were continuously bonded to the substrate surface contained in the optical film (F2A) to prepare an elongated circularly polarizing plate (P2A). That is, the circularly polarizing plate (P2A) has a polarizer protective film, a polarizer, a substrate (elongated support), an optically anisotropic layer A (first optically anisotropic layer), and an optically anisotropic layer B (second optically anisotropic layer) in this order.

The absorption axis of the polarizer coincided with the longitudinal direction of the circularly polarizing plate, the rotation angle of the in-plane slow axis of the optically anisotropic layer A with respect to the absorption axis of the polarizer was −14°, and the rotation angle of the in-plane slow axis of the surface of the optically anisotropic layer B opposite to the optically anisotropic layer A with respect to the absorption axis of the polarizer was −96°.

The rotation angle of the in-plane slow axis is represented by a positive angle value in a case where it is counterclockwise and a negative angle value in a case where it is clockwise assuming that the longitudinal direction of the substrate is defined as a reference of 0°, upon observing the polarizer from the optically anisotropic layer side.

(Preparation of Third Optically Anisotropic Layer)

The following composition (5) for forming an optically anisotropic layer was prepared, and a homogeneous solution thereof was obtained.

| Composition (5) for forming optically anisotropic layer | |
|---|---|
| Disk-like liquid crystal compound 1 | 80 parts by mass |
| Disk-like liquid crystal compound 2 | 20 parts by mass |
| Disk-like liquid crystal compound 5 | 5.6 parts by mass |
| Ethylene oxide-modified trimethylolpropane triacrylate (V# 360, manufactured by Osaka Organic Chemical Industry Ltd.) | 5.6 parts by mass |
| Fluorine-containing compound B | 0.2 parts by mass |
| Polymerization initiator (Irgacure 907, manufactured by BASF SE) | 3 parts by mass |
| Toluene | 170 parts by mass |
| Methyl ethyl ketone | 73 parts by mass |

Disk-like liquid crystal compound 5 (polymerizable triphenylene type discotic liquid crystal compound)

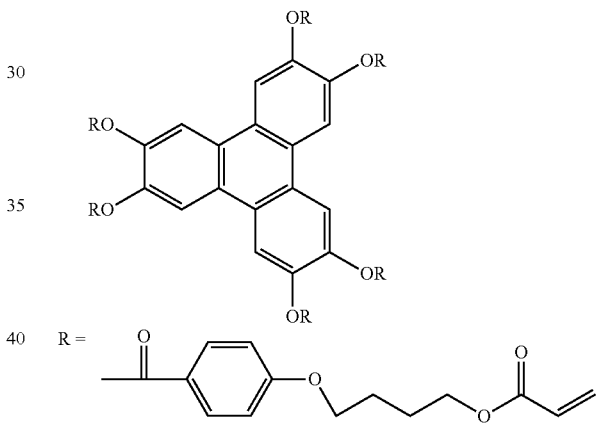

As the support, a commercially available cellulose triacetate film (FUJITAC ZRD40, manufactured by FUJIFILM Corporation) was used without being subjected to a saponification treatment.

The composition (5) for forming an optically anisotropic layer was applied onto the surface of the support, the solvent was dried in a step of continuously heating from room temperature to 100° C., and the composition layer was further heated in a drying zone at 100° C. for about 90 seconds. Then, the temperature was lowered to 60° C., the obtained film was exposed to UV light at 300 mJ/cm² in the atmosphere to proceed with a polymerization reaction, and the alignment of the liquid crystal compound was fixed to form a negative C-plate corresponding to the third optically anisotropic layer, whereby an optical film (F2B) having a substrate and a negative C-plate was obtained.

Upon observing the alignment state of the disk-like liquid crystal compound in the positive C-plate, it was found that the disk-like liquid crystal compound was horizontally aligned without any defect. The negative C-plate had a thickness of 2.0 μm, an Re(550) of 0 nm, and an Rth(550) of 69 nm.

(Preparation of Circularly Polarizing Plate)

A pressure-sensitive adhesive was bonded onto the optically anisotropic layer B contained in the above-mentioned circularly polarizing plate (P2A), the negative C-plate contained in the prepared optical film (F2B) was further bonded, and then the substrate contained in the optical film (F2B) was peeled off to prepare an elongated circularly polarizing plate (P2B). That is, the circularly polarizing plate (P2B) has a polarizer protective film, a polarizer, a substrate (elongated support), an optically anisotropic layer A (first optically anisotropic layer), an optically anisotropic layer B (second optically anisotropic layer), and a negative C-plate (third optically anisotropic layer) in this order.

Comparative Example 1

A circularly polarizing plate was prepared according to the same procedure as in Example 5 of JP5960743B, except that the support 1 was used instead of the support 8 used in Example 5 of JP5960743B.

The prepared circularly polarizing plate has a polarizer, an optically anisotropic layer B (first optically anisotropic layer), an optically anisotropic layer A (second optically anisotropic layer), and a support 1 (third optically anisotropic layer) in this order. The optical characteristics of each layer are summarized in Table 2.

Comparative Example 2

A circularly polarizing plate was prepared according to the same procedure as in Example 6 of JP5960743B, except that the support 2 was used instead of the support 7 used in Example 6 of JP5960743B.

The prepared circularly polarizing plate has a polarizing film, an optically anisotropic layer B (first optically anisotropic layer), an optically anisotropic layer A (second optically anisotropic layer), and a support 2 (third optically anisotropic layer) in this order. The optical characteristics of each layer are summarized in Table 2.

Comparative Example 3

A circularly polarizing plate was prepared according to the same procedure as in Example 7 of JP5960743B, except that the support 3 was used instead of the support 4 used in Example 7 of JP5960743B.

The prepared circularly polarizing plate has a polarizing film, an optically anisotropic layer B (first optically anisotropic layer), an optically anisotropic layer A (second optically anisotropic layer), and a support 3 (third optically anisotropic layer) in this order. The optical characteristics of each layer arc summarized in Table 2.

Comparative Example 4

A circularly polarizing plate was prepared according to the same procedure as in Example 8 of JP5960743B, except that the support 4 was used instead of the support 3 used in Example 8 of JP5960743B.

The prepared circularly polarizing plate has a polarizing film, an optically anisotropic layer B (first optically anisotropic layer), an optically anisotropic layer A (second optically anisotropic layer), and a support 4 (third optically anisotropic layer) in this order. The optical characteristics of each layer are summarized in Table 2.

<Preparation of Organic EL Display Device and Evaluation of Display Performance>

(Mounting on Display Device)

The SAMSUNG GALAXY S4 equipped with an organic EL display panel was disassembled, a circularly polarizing plate was peeled off, and the circularly polarizing plate prepared in each of Examples and Comparative Examples was attached thereto such that the polarizer protective film was disposed on the outside.

(Evaluation of Display Performance)
(Front Direction)

The prepared organic EL display device was displayed in black and observed from the front under bright light, and the tint variation was evaluated according to the following standards. The results are shown in Table 2.

4: The tint variation is not visible at all (acceptable).

3: Although the tint variation is visible, it is very slight (acceptable).

2: The tint variation is slightly visible and there is some reflected light, which is unacceptable.

1: The tint variation is visible and there is a lot of reflected light, which is unacceptable.

(Oblique Direction)

The prepared organic EL display device was displayed in black, a fluorescent lamp is projected from a polar angle of 45° under bright light, and the reflected light was observed from all directions. The azimuthal angle dependence of the tint change was evaluated according to the following standards. The results are shown in Table 2.

4: The tint difference is not visible at all (acceptable).

3: Although the tint difference is visible, it is very slight (acceptable).

2: The tint difference is visible, but the reflected light is small and there is no problem in use (acceptable).

1: The tint difference is visible and there is a lot of reflected light, which is unacceptable.

<Evaluation of Thickness>

In a case where the thickness of the obtained circularly polarizing plate is less than 50 µm, it is rated as "A", and in a case where the thickness of the obtained circularly polarizing plate is 50 µm or more, it is rated as "B".

<Continuous Productivity>

In a case of producing a circularly polarizing plate, the case where the rubbing treatment can be continuously carried out by roll-to-roll processing and the bonding of the polarizer can be continuously carried out by roll-to-roll processing is rated as "A", and the case where at least one thereof cannot be carried out is rated as "B".

In Table 2, the "Rth (nm)" represents an in-plane retardation at a wavelength of 550 nm, the "Re (nm)" represents a thickness direction retardation at a wavelength of 550 nm, and the "Δnd" represents a product of a refractive index anisotropy Δn of the second optically anisotropic layer measured at a wavelength of 550 nm and a thickness d of the second optically anisotropic layer.

In Table 2, the in-plane slow axis direction is represented by a positive angle value in a case where it is counterclockwise and a negative angle value in a case where it is clockwise assuming that the longitudinal direction of the substrate is defined as a reference of 0°, upon observing the polarizer from the optically anisotropic layer side.

In Table 2, the "CLC" represents a rod-like liquid crystal compound, the "DLC" represents a disk-like liquid crystal compound, and the "TAC" represents a cellulose acylate film.

The circularly polarizing plates in Comparative Examples 1 to 4 include supports 1 to 4, respectively. In a case where the configurations of the circularly polarizing plates of Comparative Examples 1 to 4 are described in Table 2, each layer of the circularly polarizing plate is described in the order of laminating the supports 1 to 4 corresponding to the third optically anisotropic layer of the present invention.

TABLE 2

|  |  | Example | | Comparative Example | | | |
|---|---|---|---|---|---|---|---|
|  |  | 1 | 2 | 1 | 2 | 3 | 4 |
| Elongated support | Material | TAC | TAC | — | — | — | — |
|  | Re (nm) | 0 | 0 | — | — | — | — |
|  | Rth (nm) | 0 | 0 | — | — | — | — |
|  | Film thickness (μm) | 20 | 20 | — | — | — | — |
| First optically anisotropic layer | Liquid crystal compound | CLC | CLC | DLC | CLC | DLC | CLC |
|  | Re (nm) | 168 | 168 | 181 | 181 | 181 | 181 |
|  | In-plane slow axis direction | −14° | −14° | +13° | +13° | +13° | +13° |
| Second optically anisotropic layer | Liquid crystal compound | CLC | DLC | DLC | DLC | CLC | CLC |
|  | Twist angle | 82° | 82° | 81° | 81° | 81° | 81° |
|  | Δnd (nm) | 164 | 164 | 172 | 172 | 172 | 172 |
|  | In-plane slow axis direction (first optically anisotropic layer side) | −14° | −14° | +13° | +13° | +13° | +13° |
|  | In-plane slow axis direction (third optically anisotropic layer side) | −96° | −96° | +94° | +94° | +94° | +94° |
| Third optically anisotropic layer | Liquid crystal compound | CLC | DLL | TAC | TAC | TAC | TAC |
|  | Re (nm) | 0 | 0 | 2 | 1 | 1 | 2 |
|  | Rth (nm) | −63 | 69 | 80 | 60 | −40 | −60 |
|  | Film thickness (μm) | 2 | 2 | 85 | 55 | 50 | 81 |
| Evaluation | Display performance: front direction | 4 | 4 | 4 | 4 | 4 | 4 |
|  | Display performance: oblique direction | 3 | 4 | 3 | 3 | 3 | 3 |
|  | Thickness | A | A | B | B | B | B |
|  | Continuous productivity | A | A | B | B | B | B |

As shown in the above table, the optical film according to the embodiment of the present invention exhibited a desired effect.

EXPLANATION OF REFERENCES 10a, 10b: optical film
12: elongated support
14a: first optically anisotropic layer
16a: second optically anisotropic layer
18: third optically anisotropic layer
20: composition layer
20A: lower region
20B: upper region
22: polarizer
24: organic EL display panel
100: circularly polarizing plate
200: organic EL display device

What is claimed is:

1. An optical film comprising:
an elongated support;
a first optically anisotropic layer;
a second optically anisotropic layer; and
a third optically anisotropic layer in this order,
wherein a thickness of the elongated support is 10 to 45 μm,
the first optically anisotropic layer is a layer formed of a rod-like liquid crystal compound,
the second optically anisotropic layer is a layer formed by fixing a twist-aligned liquid crystal compound having a helical axis in a thickness direction,
the third optically anisotropic layer is a layer formed of a liquid crystal compound,
an angle formed by a longitudinal direction of the elongated support and an in-plane slow axis of the first optically anisotropic layer is 5° to 50°,
the in-plane slow axis of the first optically anisotropic layer is parallel to an in-plane slow axis on a surface of the second optically anisotropic layer on a first optically anisotropic layer side,
a twist angle of the twist-aligned liquid crystal compound in the second optically anisotropic layer is 90°±30°,
in a case where the in-plane slow axis of the first optically anisotropic layer is rotated 50 to 50° clockwise with respect to the longitudinal direction of the elongated support upon observation from a third optically anisotropic layer side toward an elongated support side, an in-plane slow axis on a surface of the second optically anisotropic layer opposite to the first optically anisotropic layer side is rotated clockwise with respect to the in-plane slow axis on the surface of the second optically anisotropic layer on the first optically anisotropic layer side, in a case where the in-plane slow axis of the first optically anisotropic layer is rotated 5° to 50° counterclockwise with respect to the longitudinal direction of the elongated support upon observation from the third optically anisotropic layer side toward the elongated support side, the in-plane slow axis on the surface of the second optically anisotropic layer opposite to the first optically anisotropic layer side is rotated counterclockwise with respect to the in-plane slow axis on the surface of the second optically anisotropic layer on the first optically anisotropic layer side, an in-plane retardation of the first optically anisotropic layer at a wavelength of 550 nm is 140 to 220 nm, a value of a product Δnd of a refractive index anisotropy Δn of the second optically anisotropic layer measured at a wavelength of 550 nm and a thickness d of the second optically anisotropic layer is 140 to 220 nm, in a case where the twist-aligned liquid crystal compound of the second optically anisotropic layer is a rod-like liquid crystal compound, an in-plane retardation of the third optically anisotropic layer at a wavelength of 550 nm is 0 to 10 nm, and a thickness direction retardation of the third optically anisotropic layer at a wavelength of 550 nm is −120 to −20 nm, and in a case where the twist-aligned liquid crystal compound of the second optically anisotropic layer is a disk-like liquid crystal compound, an in-plane retardation of the third optically anisotropic layer at a wavelength of 550 nm is 0 to 10 nm, and a thickness direction retardation of the third optically anisotropic layer at a wavelength of 550 nm is 20 to 120 nm.

2. The optical film according to claim 1,
wherein an alignment film is substantially not disposed between the elongated support and the first optically anisotropic layer.

3. The optical film according to claim 1,
wherein the angle formed by the longitudinal direction of the elongated support and the in-plane slow axis of the first optically anisotropic layer is 10° to 25°.

4. The optical film according to claim 1,
wherein the first optically anisotropic layer is a layer formed by fixing a homogeneously aligned rod-like liquid crystal compound.

5. A circularly polarizing plate comprising:
the optical film according to claim 1; and
a polarizer.

6. An organic electroluminescence display device comprising the circularly polarizing plate according to claim 5.

7. The optical film according to claim 2,
wherein the angle formed by the longitudinal direction of the elongated support and the in-plane slow axis of the first optically anisotropic layer is 10° to 25°.

8. The optical film according to claim 2,
wherein the first optically anisotropic layer is a layer formed by fixing a homogeneously aligned rod-like liquid crystal compound.

9. A circularly polarizing plate comprising:
the optical film according to claim 2; and
a polarizer.

10. An organic electroluminescence display device comprising the circularly polarizing plate according to claim 9.

11. The optical film according to claim 3,
wherein the first optically anisotropic layer is a layer formed by fixing a homogeneously aligned rod-like liquid crystal compound.

12. A circularly polarizing plate comprising:
the optical film according to claim 3; and
a polarizer.

13. An organic electroluminescence display device comprising the circularly polarizing plate according to claim 12.

14. A circularly polarizing plate comprising:
the optical film according to claim 4; and
a polarizer.

15. An organic electroluminescence display device comprising the circularly polarizing plate according to claim 14.

* * * * *